(12) United States Patent
Yamazaki et al.

(10) Patent No.: US 8,704,233 B2
(45) Date of Patent: Apr. 22, 2014

(54) SEMICONDUCTOR DEVICE AND METHOD OF MANUFACTURING THE SAME

(71) Applicant: Semiconductor Energy Laboratory Co., Ltd., Atsugi (JP)

(72) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/829,922

(22) Filed: Mar. 14, 2013

(65) Prior Publication Data

US 2013/0207116 A1   Aug. 15, 2013

Related U.S. Application Data

(63) Continuation of application No. 13/071,759, filed on Mar. 25, 2011, now Pat. No. 8,399,884, which is a continuation of application No. 12/498,696, filed on Jul. 7, 2009, now Pat. No. 7,915,615, which is a continuation of application No. 11/287,187, filed on Nov. 28, 2005, now Pat. No. 7,556,903, which is a continuation of application No. 09/773,543, filed on Feb. 2, 2001, now Pat. No. 7,023,021.

(30) Foreign Application Priority Data

Feb. 22, 2000   (JP) .................................. 2000-044973

(51) Int. Cl.
*H01L 33/00*   (2010.01)

(52) U.S. Cl.
USPC .......... 257/59; 257/72; 257/88; 257/E33.062; 257/E33.053; 349/33

(58) Field of Classification Search
USPC ................ 257/59, 72, 88, E33.062, E33.053; 349/33
See application file for complete search history.

(56) References Cited

U.S. PATENT DOCUMENTS

| | | | |
|---|---|---|---|
| 4,341,593 A | 7/1982 | Kurisaki et al. | |
| 4,583,122 A | 4/1986 | Ohwada et al. | |

(Continued)

FOREIGN PATENT DOCUMENTS

| | | |
|---|---|---|
| EP | 0 095 776 A1 | 12/1983 |
| EP | 0 484 965 A2 | 5/1992 |

(Continued)

OTHER PUBLICATIONS

Office Action, Korean Application No. 2007-0095469, mailed Dec. 31, 2008 with English translation, 11 pages.

(Continued)

*Primary Examiner* — Victor A Mandala
(74) *Attorney, Agent, or Firm* — Fish & Richardson P.C.

(57) ABSTRACT

The present invention improves the aperture ratio of a pixel of a reflection-type display device or a reflection type display device without increasing the number of masks and without using a blackmask. A pixel electrode (167) is arranged so as to partially overlap a source wiring (137) for shielding the gap between pixels from light, and a thin film transistor is arranged so as to partially overlap a gate wiring (166) for shielding a channel region of the thin film transistor from light, thereby realizing a high pixel aperture ratio.

20 Claims, 25 Drawing Sheets

(56) References Cited

U.S. PATENT DOCUMENTS

| | | |
|---|---|---|
| 4,914,503 A | 4/1990 | Shirato et al. |
| 5,008,218 A | 4/1991 | Kawachi et al. |
| 5,075,674 A | 12/1991 | Katayama et al. |
| 5,153,685 A | 10/1992 | Murata et al. |
| 5,182,620 A | 1/1993 | Shimada et al. |
| 5,483,082 A | 1/1996 | Takizawa et al. |
| 5,491,352 A | 2/1996 | Tsuji |
| 5,550,070 A | 8/1996 | Funai et al. |
| 5,576,858 A | 11/1996 | Ukai et al. |
| 5,608,251 A | 3/1997 | Konuma et al. |
| 5,614,730 A | 3/1997 | Nakazawa et al. |
| 5,620,905 A | 4/1997 | Konuma et al. |
| 5,636,329 A | 6/1997 | Sukegawa et al. |
| 5,643,826 A | 7/1997 | Ohtani et al. |
| 5,644,147 A | 7/1997 | Yamazaki et al. |
| 5,650,636 A | 7/1997 | Takemura et al. |
| 5,712,495 A | 1/1998 | Suzawa |
| 5,717,224 A | 2/1998 | Zhang |
| 5,739,549 A | 4/1998 | Takemura et al. |
| 5,744,820 A | 4/1998 | Matsushima et al. |
| 5,757,444 A | 5/1998 | Takemura |
| 5,777,701 A | 7/1998 | Zhang |
| 5,780,872 A | 7/1998 | Misawa et al. |
| 5,804,501 A | 9/1998 | Kim |
| 5,815,226 A | 9/1998 | Yamazaki et al. |
| 5,818,070 A | 10/1998 | Yamazaki et al. |
| 5,821,138 A | 10/1998 | Yamazaki et al. |
| 5,828,429 A | 10/1998 | Takemura |
| 5,838,412 A | 11/1998 | Ueda et al. |
| 5,852,488 A | 12/1998 | Takemura |
| 5,856,689 A | 1/1999 | Suzawa |
| 5,892,562 A | 4/1999 | Yamazaki et al. |
| 5,899,547 A | 5/1999 | Yamazaki et al. |
| 5,917,563 A | 6/1999 | Matsushima |
| 5,920,083 A | 7/1999 | Bae |
| 5,923,962 A | 7/1999 | Ohtani et al. |
| 5,929,948 A | 7/1999 | Ohori et al. |
| 5,930,607 A | 7/1999 | Satou |
| 5,953,084 A | 9/1999 | Shimada et al. |
| 5,953,088 A | 9/1999 | Hanazawa et al. |
| 5,977,562 A | 11/1999 | Hirakata et al. |
| 5,985,746 A | 11/1999 | Kapoor |
| 5,990,542 A | 11/1999 | Yamazaki |
| 5,990,998 A | 11/1999 | Park et al. |
| 5,990,999 A | 11/1999 | Yeo |
| 5,994,235 A | 11/1999 | O'Donnell |
| 5,998,841 A | 12/1999 | Suzawa |
| 6,008,065 A | 12/1999 | Lee et al. |
| 6,022,753 A | 2/2000 | Park et al. |
| 6,031,290 A | 2/2000 | Miyazaki et al. |
| 6,031,589 A | 2/2000 | Kim |
| 6,043,859 A | 3/2000 | Maeda |
| 6,052,162 A | 4/2000 | Shimada et al. |
| 6,067,132 A | 5/2000 | Kim |
| 6,072,556 A | 6/2000 | Hirakata et al. |
| 6,081,308 A | 6/2000 | Jeong et al. |
| 6,097,452 A | 8/2000 | Shimada et al. |
| 6,104,461 A | 8/2000 | Zhang et al. |
| 6,114,715 A | 9/2000 | Hamada |
| 6,115,088 A | 9/2000 | Zhang et al. |
| 6,118,506 A | 9/2000 | Yamazaki et al. |
| 6,124,604 A | 9/2000 | Koyama et al. |
| 6,166,396 A | 12/2000 | Yamazaki |
| 6,172,369 B1 * | 1/2001 | Waechter et al. ........ 250/370.09 |
| 6,175,395 B1 | 1/2001 | Yamazaki et al. |
| 6,195,138 B1 | 2/2001 | Shimada et al. |
| 6,198,133 B1 | 3/2001 | Yamazaki et al. |
| 6,198,517 B1 | 3/2001 | Ohori et al. |
| 6,208,395 B1 | 3/2001 | Kanoh et al. |
| 6,218,196 B1 | 4/2001 | Ise et al. |
| 6,218,206 B1 | 4/2001 | Inoue et al. |
| 6,229,513 B1 | 5/2001 | Nakano et al. |
| 6,239,854 B1 | 5/2001 | Hirakata et al. |
| 6,252,248 B1 | 6/2001 | Sano et al. |
| 6,274,887 B1 | 8/2001 | Yamazaki et al. |
| 6,278,131 B1 | 8/2001 | Yamazaki et al. |
| 6,281,552 B1 | 8/2001 | Kawasaki et al. |
| 6,303,963 B1 | 10/2001 | Ohtani et al. |
| 6,323,490 B1 | 11/2001 | Ikeda et al. |
| 6,323,515 B1 | 11/2001 | Yamazaki et al. |
| 6,337,520 B1 | 1/2002 | Jeong et al. |
| 6,337,731 B1 | 1/2002 | Takemura |
| 6,341,003 B1 | 1/2002 | Ashizawa et al. |
| 6,358,766 B1 | 3/2002 | Kasahara |
| 6,376,333 B1 | 4/2002 | Yamazaki et al. |
| 6,380,098 B1 | 4/2002 | Jeong et al. |
| 6,384,818 B1 | 5/2002 | Yamazaki et al. |
| 6,392,255 B1 | 5/2002 | Shibata et al. |
| 6,421,101 B1 | 7/2002 | Zhang et al. |
| 6,433,851 B2 | 8/2002 | Shimada et al. |
| 6,441,468 B1 | 8/2002 | Yamazaki |
| 6,445,004 B1 | 9/2002 | Jeong et al. |
| 6,445,059 B1 | 9/2002 | Yamazaki |
| 6,461,899 B1 | 10/2002 | Kitakado et al. |
| 6,469,317 B1 | 10/2002 | Yamazaki et al. |
| 6,486,494 B2 | 11/2002 | Jeong et al. |
| 6,489,222 B2 | 12/2002 | Yoshimoto |
| 6,493,052 B1 | 12/2002 | Satake et al. |
| 6,501,098 B2 | 12/2002 | Yamazaki |
| 6,524,877 B1 | 2/2003 | Nakazawa et al. |
| 6,545,736 B2 | 4/2003 | Ashizawa et al. |
| 6,556,265 B1 | 4/2003 | Murade |
| 6,567,146 B2 | 5/2003 | Hirakata et al. |
| 6,570,182 B2 | 5/2003 | Jeong et al. |
| 6,582,982 B2 | 6/2003 | Jeong et al. |
| 6,608,353 B2 | 8/2003 | Miyazaki et al. |
| RE38,292 E | 10/2003 | Satou |
| 6,630,687 B1 | 10/2003 | Koyama et al. |
| 6,686,606 B2 | 2/2004 | Jeong et al. |
| 6,690,031 B1 | 2/2004 | Ohtani et al. |
| 6,693,681 B1 | 2/2004 | Takemura |
| 6,697,142 B2 | 2/2004 | Ashizawa et al. |
| 6,750,931 B2 | 6/2004 | Satake et al. |
| 6,756,740 B2 | 6/2004 | Inukai |
| 6,762,813 B1 | 7/2004 | Zhang et al. |
| 6,765,562 B2 | 7/2004 | Yamazaki et al. |
| 6,787,887 B2 | 9/2004 | Yamazaki |
| 6,912,033 B2 | 6/2005 | Ashizawa et al. |
| 6,946,681 B2 | 9/2005 | Jeong et al. |
| RE38,901 E | 11/2005 | Park et al. |
| 6,977,394 B2 | 12/2005 | Yamazaki et al. |
| 6,982,768 B2 | 1/2006 | Ohori et al. |
| 6,998,282 B1 | 2/2006 | Yamazaki et al. |
| 7,023,021 B2 | 4/2006 | Yamazaki et al. |
| 7,023,502 B2 | 4/2006 | Zhang et al. |
| 7,034,335 B2 | 4/2006 | Fujikawa et al. |
| 7,034,381 B2 | 4/2006 | Yamazaki |
| 7,046,313 B2 | 5/2006 | Zhang et al. |
| 7,064,388 B2 | 6/2006 | Hayakawa et al. |
| 7,102,169 B2 | 9/2006 | Koyama et al. |
| 7,126,161 B2 | 10/2006 | Yamazaki |
| 7,202,551 B2 | 4/2007 | Yamazaki |
| 7,251,007 B2 | 7/2007 | Ashizawa et al. |
| 7,268,777 B2 | 9/2007 | Yamazaki et al. |
| 7,323,717 B2 | 1/2008 | Koyama et al. |
| 7,333,169 B2 | 2/2008 | Zhang et al. |
| 7,413,937 B2 | 8/2008 | Yamazaki |
| 7,425,931 B1 | 9/2008 | Yamazaki et al. |
| 7,460,201 B2 | 12/2008 | Ashizawa et al. |
| 7,489,291 B2 | 2/2009 | Yamazaki et al. |
| 7,532,208 B2 | 5/2009 | Yamazaki et al. |
| 7,550,325 B2 | 6/2009 | Koyama et al. |
| 7,566,903 B2 | 7/2009 | Yamazaki et al. |
| 7,786,958 B1 | 8/2010 | Koyama |
| 7,915,615 B2 | 3/2011 | Yamazaki et al. |
| 2001/0009383 A1 * | 7/2001 | Nakayama et al. ........... 326/121 |
| 2001/0025959 A1 | 10/2001 | Yamazaki et al. |
| 2002/0008797 A1 | 1/2002 | Jeong et al. |
| 2002/0013021 A1 | 1/2002 | Jeong et al. |
| 2002/0044230 A1 | 4/2002 | Yamazaki et al. |
| 2002/0060323 A1 | 5/2002 | Jeong et al. |
| 2002/0110941 A1 | 8/2002 | Yamazaki et al. |
| 2002/0175395 A1 | 11/2002 | Jeong et al. |
| 2003/0160252 A1 | 8/2003 | Jeong et al. |

(56) References Cited

U.S. PATENT DOCUMENTS

| | | |
|---|---|---|
| 2003/0207506 A1 | 11/2003 | Satou |
| 2004/0029338 A1* | 2/2004 | Yamazaki et al. ............ 438/202 |
| 2004/0140566 A1 | 7/2004 | Jeong et al. |
| 2005/0082541 A1 | 4/2005 | Satou |
| 2005/0084999 A1 | 4/2005 | Satou |
| 2005/0104071 A1 | 5/2005 | Satou |
| 2005/0162421 A1 | 7/2005 | Yamazaki et al. |
| 2005/0162578 A1 | 7/2005 | Yamazaki et al. |
| 2005/0233509 A1 | 10/2005 | Satou |
| 2006/0146266 A1* | 7/2006 | Zhang et al. .................. 349/155 |
| 2006/0192201 A1 | 8/2006 | Zhang et al. |
| 2008/0106656 A1 | 5/2008 | Zhang et al. |
| 2008/0224215 A1* | 9/2008 | Yamazaki et al. ............ 257/347 |
| 2008/0309585 A1 | 12/2008 | Yamazaki et al. |
| 2009/0015534 A1 | 1/2009 | Zhang |
| 2009/0147202 A1 | 6/2009 | Ashizawa et al. |
| 2009/0195523 A1 | 8/2009 | Yamazaki et al. |
| 2009/0207332 A1* | 8/2009 | Zhang et al. ..................... 349/43 |
| 2009/0231533 A1 | 9/2009 | Koyama et al. |
| 2011/0230018 A1* | 9/2011 | Yamazaki et al. ............ 438/154 |

FOREIGN PATENT DOCUMENTS

| | | |
|---|---|---|
| EP | 0 650 197 A2 | 4/1995 |
| EP | 0 762 184 A1 | 3/1997 |
| EP | 1 001 467 A1 | 5/2000 |
| EP | 1 028 469 A1 | 8/2000 |
| EP | 1 058 310 A1 | 12/2000 |
| EP | 1 058 484 A1 | 12/2000 |
| EP | 1 128 430 A2 | 8/2001 |
| EP | 1 538 676 A1 | 6/2005 |
| JP | 60-235468 A | 11/1985 |
| JP | 64-059215 A | 3/1989 |
| JP | 01-101519 A | 4/1989 |
| JP | 02-082571 A | 3/1990 |
| JP | 03-175430 A | 7/1991 |
| JP | 4307521 A | 10/1992 |
| JP | 04-313729 A | 11/1992 |
| JP | 05-027266 A | 2/1993 |
| JP | 05-053127 A | 3/1993 |
| JP | 05-210090 A | 8/1993 |
| JP | 05-241200 A | 9/1993 |
| JP | 06-034996 A | 2/1994 |
| JP | 6067210 A | 3/1994 |
| JP | 06-138488 A | 5/1994 |
| JP | 06-148685 A | 5/1994 |
| JP | 06-160904 A | 6/1994 |
| JP | 6167722 A | 6/1994 |
| JP | 6194689 A | 7/1994 |
| JP | 06-250221 A | 9/1994 |
| JP | 06-324350 A | 11/1994 |
| JP | 07-005487 A | 1/1995 |
| JP | 07-130652 A | 5/1995 |
| JP | 07-135323 A | 5/1995 |
| JP | 07-175038 A | 7/1995 |
| JP | 07-235680 A | 9/1995 |
| JP | 07-294870 A | 11/1995 |
| JP | 08-240816 A | 9/1996 |
| JP | 08-274336 A | 10/1996 |
| JP | 08-330602 A | 12/1996 |
| JP | 09-080477 A | 3/1997 |
| JP | 09-138387 A | 5/1997 |
| JP | 9129890 A | 5/1997 |
| JP | 09-146120 A | 6/1997 |
| JP | 09-160509 A | 6/1997 |
| JP | 09-223804 A | 8/1997 |
| JP | 10-048640 A | 2/1998 |
| JP | 10-062819 A | 3/1998 |
| JP | 10-078593 A | 3/1998 |
| JP | 10-096962 A | 4/1998 |
| JP | 10104663 A | 4/1998 |
| JP | 10-133217 A | 5/1998 |
| JP | 10-153796 A | 6/1998 |
| JP | 10-161140 A | 6/1998 |
| JP | 10-198292 A | 7/1998 |
| JP | 10209452 A | 8/1998 |
| JP | 10253989 A | 9/1998 |
| JP | 10-270363 A | 10/1998 |
| JP | 10-282527 A | 10/1998 |
| JP | 11002836 A | 1/1999 |
| JP | 11-052420 A | 2/1999 |
| JP | 11-054877 A | 2/1999 |
| JP | 11-097698 A | 4/1999 |
| JP | 11095256 A | 4/1999 |
| JP | 11183936 A | 7/1999 |
| JP | 11-212073 A | 8/1999 |
| JP | 11-271807 A | 10/1999 |
| JP | 11-274524 A | 10/1999 |
| JP | 11-282011 A | 10/1999 |
| JP | 11-282012 A | 10/1999 |
| JP | 11-295764 A | 10/1999 |
| JP | 11-311805 A | 11/1999 |
| JP | 11-354802 A | 12/1999 |
| JP | 2000-010120 A | 1/2000 |
| JP | 2000-047244 A | 2/2000 |
| JP | 2001-313397 A | 11/2001 |
| JP | 11-344726 A | 10/2005 |
| KR | 1999-025891 A | 4/1999 |
| KR | 1999-63412 A | 7/1999 |
| KR | 1999-065725 A | 8/1999 |
| KR | 1999-0076545 A | 10/1999 |
| KR | 1999-080392 A | 11/1999 |
| KR | 1999-084732 A | 12/1999 |
| KR | 1999-087841 A | 12/1999 |
| KR | 1999-088600 A | 12/1999 |
| WO | WO/97-13177 A1 | 4/1997 |

OTHER PUBLICATIONS

Search Report, European Application No. 01104319.7; mailed Jun. 16, 2010, 6 pages.

Chinese Office Action (Chinese Application No. 200610156213.9), 16 pages, mailed Jul. 25, 2008 with English translation.

Office Action in People's Republic of China Application No. 01117390.4 with English translation; Dec. 24, 2004.

Korean Office Action (Korean Application No. 2007-0095469), 12 pages, mailed Jun. 17, 2008 with English translation.

Office Action (Korean Patent Application No. 2005-0131599) mailed Jul. 31, 2007 with English translation, 9 pages.

Office Action (Korean Application No. 2007-0095469) mailed Dec. 21, 2008 with English translation, 11 pages.

T. Veda, '94 The Latest LCD Technology, "Improvement of Aperture Ratio by Shield Electrode Structure," Issued Oct. 15, 1993, Extra Edition, 1993, vol. 12, No. 13, pp. 136-138 with full English translation.

European Search Report (Application No. 01104319.7) mailed Oct. 6, 2010 (7 pages).

Japanese Patent Application Laid-Open No. 10-189252, published Jul. 21, 1998 (English Abstract attached).

\* cited by examiner

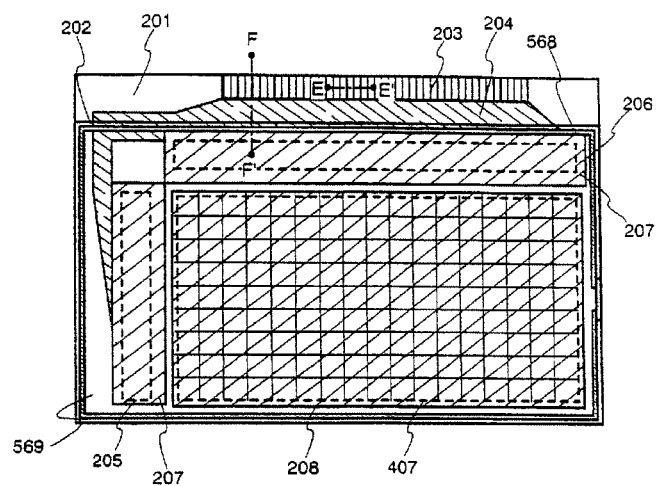
FIG. 7A top view
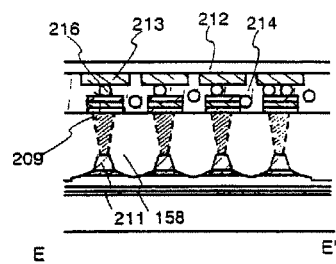
FIG. 7B cross sectional view of E-E'

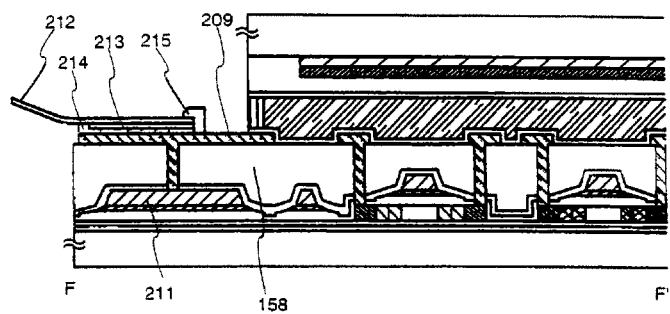
FIG. 8A cross sectional view of F-F'
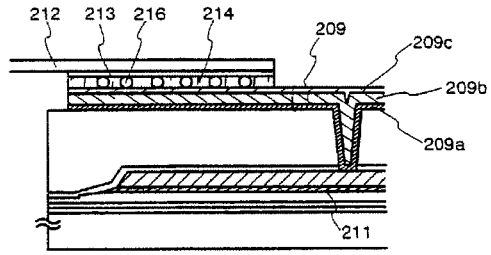
FIG. 8B

405: storage capacitor

SEMICONDUCTOR DEVICE AND METHOD OF MANUFACTURING THE SAME

CROSS-REFERENCE TO RELATED APPLICATIONS

This application is a continuation of U.S. application Ser. No. 13/071,759, filed Mar. 25, 2011, now U.S. Pat. No. 8,399,884, which a continuation of U.S. application Ser. No. 12/498,696, filed Jul. 7, 2009, now U.S. Pat. No. 7,915,615, which is a continuation of U.S. application Ser. No. 11/287,187, filed Nov. 28, 2005, now U.S. Pat. No. 7,566,903, which is a continuation of U.S. application Ser. No. 09/773,543, filed Feb. 2, 2001, now U.S. Pat. No. 7,023,021, which claims the benefit of a foreign priority application filed in Japan as Serial No. 2000-044973 on Feb. 22, 2000, all of which axe incorporated by reference.

BACKGROUND OF THE INVENTION

1. Field of the Invention

The present invention relates to a semiconductor device having a circuit constituted by thin film transistors (hereinafter, abbreviated as TFTs) and a method of manufacturing the same. For example, the present invention relates to an electro-optical device as is represented by a liquid crystal display panel and an electric appliance including such an electro-optical device as a component.

In the specification, the term "semiconductor device" generically indicates the devices capable of functioning by taking advantage of semiconductor properties; an electro-optical devices, a semiconductor circuit and an electric appliance are all included in the semiconductor device.

2. Description of the Related Art

A technique for constituting a TFT by using a semiconductor thin film (having a thickness of about several nm to about several hundreds of nm) formed on a substrate having an insulating surface has lately attracted attention. The TFT is widely used for electronic appliances such as an IC and an electro-optical device. Particularly, there is an urgent need to develop the TFT as a switching element for a liquid crystal display device.

Among liquid crystal display devices, an active matrix liquid crystal display device, in which pixel electrodes are arranged in a matrix and TFTs are used as switching elements respectively connected to pixel electrodes for obtaining a high-quality image, has particularly drawn attention.

The active matrix liquid crystal display device is mainly classified into two known types; a transmission-type and a reflection-type.

Particularly, as compared with the transmission-type liquid crystal display device, the reflection-type liquid crystal display device is advantageous in small power consumption because a backlight is not used for display. For such an advantage, the reflection-type liquid crystal display device is more and more demanded as a direct-view display for mobile computers or video cameras. The reflection-type liquid crystal display device makes use of the optical modulation effects of liquid crystal to select the state where incident light is reflected at the pixel electrode to be output to the outside of the device or the state where incident liquid is not output to the outside of the device so as to display a bright region or a dark region. The reflection-type liquid crystal display device further combines the bright region and the dark region to display an image. Generally, a pixel electrode in the reflection-type liquid crystal display device is made of a metal material having a high light reflectance such as aluminum, and is electrically connected to a switching element such as a TFT.

A pixel structure in a conventional reflection-type liquid crystal display device is shown in FIG. 23. In FIG. 23, two wirings, i.e., a gate wiring (scanning line) 11 and a capacitor wiring 12, are formed into a linear shape by patterning. A source wiring (signal line) 14 is also formed into a linear shape by patterning. The source wiring 14 is arranged in a row direction while the gate wiring 11 is arranged in a column direction. Between the source wiring 14 and the gate wiring 11, an interlayer insulating film is provided to insulate these wirings from each other. The source wiring 14 and the gate wiring 11 partially cross each other. This conventional structure is characteristic in that a TFT including a semiconductor layer 10 as an active layer is disposed in the vicinity of the intersection of these wirings.

Conventionally, it is known that a pixel electrode 15 is formed between the source wirings 14, simultaneously with the formation of the source wiring 14. In the case where such a structure is employed, a region between the source wiring 14 and the pixel electrode 15 is required to be shielded from light by using a light-shielding film (also referred to as a black matrix) 13.

Moreover, in the conventional structure, a metal film made of chromium or the like is patterned into a desired shape so as to obtain the light-shielding film 13. As a result of employing the conventional method, the number of steps and the number of masks for forming the light-shielding film itself increase. For sufficient light-shield with the light-shielding film 13, it is necessary to insulate the light-shielding film 13 and the pixel electrode from each other by providing an interlayer insulating film therebetween. Similarly with the light-shielding film, when the number of layers constituting the interlayer insulating film increases, the number of manufacturing steps correspondingly increases, resulting in a rise in manufacturing cost. Furthermore, this increase in the number of layers of the interlayer insulating film is disadvantageous in preservation of the interlayer insulation property.

As another conventional structure, a structure, in which an interlayer insulating film is provided so as to cover the source wiring 11 and the pixel electrode is provided thereon, is known. In the case where such a structure is used, however, the number of layers increases to increase the number of steps, resulting in a rise in manufacturing cost.

Furthermore, in terms of display performance, the pixel is desired to have a large amount of a storage capacitor as well as a high aperture ratio. A high aperture ratio of each, pixel improves a light utilization efficiency to reduce the power consumption and the size of a display device.

Recently, the pixel size becomes smaller to obtain an image of higher definition. The reduction in pixel size increases the area where a TFT and a wiring are to be formed for one pixel, thereby adversely decreasing a pixel aperture ratio.

Thus, in order to obtain a high aperture ratio of each pixel with the defined pixel size, it is indispensable to effectively layout circuit components that are necessary for the circuit structure of a pixel.

As describe above, in order to realize a reflection-type liquid crystal display device or a transmission-type liquid crystal display device having a high pixel aperture ratio with the reduced number of masks, a completely novel pixel structure that does not correspond to any conventional structure is desired.

The present invention is to satisfy such a need and has a propose of providing a liquid crystal display device having a pixel structure of a high pixel aperture ratio realized by the present invention without increasing the number of masks and the number of manufacturing steps.

SUMMARY OF THE INVENTION

In order to solve the above-described problems of the conventional technique, the following measures are devised.

The present invention is characteristic of a pixel structure for shielding TFTs and a region between pixels from light without using a black matrix. The present invention is characterized in that, as one of the means of shielding the TFT from light, a gate electrode and a source wiring are formed on a first insulating film and that a large part of a semiconductor layer serving as an active layer is covered with a gate wiring formed on a second insulating film that is different from the first insulating film. The present invention is characterized in that, as one of the means of shielding the region between pixels from light, a pixel electrode is arranged so as to overlap the source wiring. Furthermore, the present invention is also characterized in that, as one of the means for shielding the TFT from light, a color filter (a red color filter or a lamination film of a red color filter and a blue filter) is disposed as a light-shielding film on a counter substrate so as to overlap the TFTs on an element substrate.

The structure of the present invention disclosed in the present specification relates to a semiconductor device comprising:

a semiconductor layer (a first semiconductor layer 172) having a source region, a drain region, and a channel formation region sandwiched between the source region and the drain region on an insulating surface;

a first insulating film on the semiconductor layer (the first semiconductor layer 172);

an electrode (a first electrode 134 including a gate electrode) overlapping the channel formation region on the first insulating film;

a source wiring on the first insulating film;

a second insulating film covering the electrode (the first electrode 134 including the gate electrode) and the source wiring; and a gate wiring 166 connected to the electrode (the first electrode 134 including the gate electrode) on the second insulating film.

Further, the structure of the present invention disclosed in the present specification relates to a semiconductor device comprising:

a semiconductor layer (a first semiconductor layer 172) having a source region, a drain region, and a channel formation region sandwiched between the source region and the drain region on an insulating surface;

a first insulating film on the semiconductor layer (the first semiconductor layer 172);

an electrode (a first electrode including a gate electrode 134) overlapping the channel formation region on the first insulating film;

a source wiring on the first insulating film;

a second insulating film covering the electrode and the source wiring;

a gate wiring connected to the electrode on the second insulating film;

a connection electrode 165 connected to the source wiring and the semiconductor layer (specifically, a source region or a drain region) on the second insulating film; and a pixel electrode 167 connected to the semiconductor layer (specifically, the source region or the drain region) on the second insulating film.

Further, in the above-mentioned structure, the pixel electrode is arranged so as to overlap the source wiring, while sandwiching the second insulating film therebetween, to thereby shield light (or to reduce light leaking) between the pixel electrode and source wiring.

Further, in the above-mentioned respective structures, the semiconductor device is characterized in that the semiconductor layer has a region overlapping the gate wiring, while sandwiching the first insulating film therebetween.

Further, among the above-mentioned semiconductor layers, a region of the semiconductor layer overlapping the gate wiring while sandwiching the first insulating film therebetween, is characterized by including at least a channel formation region, a region present between the channel formation region and the drain region, or a region present between the channel formation region and the source region. This region is protected from external light.

In the case of a multi-gate structure in which a plurality of gate electrodes are present on one semiconductor layer while sandwiching the first insulating film therebetween, a plurality of channel formation regions are present on the semiconductor layer. It is desirable to arrange the gate wiring so as to overlap the region present between one channel formation region and another channel formation region.

Further, the present invention is characterized in that, in order to prevent the number of masks from increasing, the electrode and the source wiring are formed of the same material on the first insulating film, and in that the pixel electrode, the connection electrode and the gate wiring are formed of the same material on the second insulating film.

Further, in the above-mentioned respective structures, the semiconductor device is characterized in that the gate wiring is made of a film containing as a main component an element selected from the group consisting of poly-Si to which an impurity element for imparting a conductivity is doped, W, $WSi_x$, Al, Cu, Ta, Cr and Mo, or a lamination film thereof.

Further, in the above-mentioned respective structures, the semiconductor device is characterized in that the first insulating film for insulating between the first electrode and the semiconductor layer is a gate insulating film.

Further, in the above-mentioned respective structures, the semiconductor device is characterized in that the second insulating film for insulating a source wiring and a gate wiring includes a first insulating layer containing silicon as a main component and a second insulating layer made of an organic resin material.

Further, in the above-mentioned respective structures, the semiconductor device is characterized in that one pixel including the pixel electrode forms a storage capacitor with the semiconductor layer (a second semiconductor layer 173) connected to the pixel electrode and the electrode (a second electrode 135) connected to a gate wiring of an adjacent pixel, using the first insulating film as a dielectric. Further, it is preferable that an impurity element imparting a p-type conductivity is added to this semiconductor layer (the second semiconductor layer 173).

Further, another structure of the present invention relates to a semiconductor device including TFTs, each TFT comprising a semiconductor layer formed on an insulating surface, an insulating film formed on the semiconductor layer, and a gate electrode formed on the insulating film, characterized in that the gate electrode includes a first electrically conductive layer having a tapered end portion as a lower layer and a second electrically conductive layer having a width smaller than that of the first electrically conductive layer as an upper layer, and in that the semiconductor layer includes a channel formation region overlapping the second electrically conductive layer sandwiching the insulating film therebetween, a third impurity region formed in contact with the channel formation region, a second impurity region formed in contact with the third impurity region, and a first impurity region formed in contact with the second impurity region.

Further, an angle formed between a side slope of the first electrically conductive layer and the horizontal plane (also referred to as a tapered angle) is smaller than that between a side slope of the second electrically conductive layer and the horizontal plane. For convenience, the side slope having a tapered angle is referred to as a tapered shape, and a portion having a tapered shape is referred to as a tapered portion in this specification.

Further, in the above structure, the third impurity region is characterized by overlapping the first electrically conductive layer, while sandwiching the insulating film therebetween. The third impurity region is formed by doping for adding an impurity element to the semiconductor layer through the first electrically conductive layer having a tapered portion on its end and the insulating film. In the doping, the thicker the thickness of the material layer positioned on the semiconductor layer becomes, the shallower ions are implanted. Therefore, the concentration of an impurity element to be added to the semiconductor layer is affected by the thickness of the electrically conductive layer having a tapered shape, resulting in a change in the concentration of the impurity element. With the increase in the thickness of the first electrically conductive layer, the concentration of an impurity in the semiconductor layer decreases. In the same manner, with the decrease in the thickness of the first electrically conductive layer, the concentration of an impurity in the semiconductor layer increases.

Further, in the above-mentioned structure, the semiconductor device is characterized in that the first impurity region is a source region or a drain region.

Moreover, in the above-mentioned structure, the semiconductor device is characterized in that a region of the insulating film overlapping the second impurity region includes a tapered portion. The second impurity region is formed by doping for adding an impurity element to the semiconductor layer through the insulating film. Therefore, the concentration of the impurity of the second impurity region is affected by the tapered portion of the insulating film to change the distribution of the concentration of the impurity of the second impurity region. With the increase in the thickness of the insulating film, the concentration of the impurity in the second impurity region decreases. In the same manner, with the reduction in the thickness of the insulating film, the concentration of the impurity in the second impurity region increases. Although the second impurity region is formed by the same doping as that for the third impurity region, the concentration of an impurity in the second impurity region is higher than that of the third impurity region because the second impurity region does not overlap the first electrically conductive layer. The width of the second impurity region in the longitudinal direction of the channel is as long as that of the third impurity region, or is greater than that of the third impurity region.

Furthermore, the above structure is characterized in that the TFT is an n-channel TFT or a p-channel TFT. Further, in the present invention, a pixel TFT is formed by using an n-channel TFT. In addition, a driver circuit including a CMOS circuit using these n-channel TFTs or p-channel TFTs is formed.

Further, the structure of the present invention disclosed in the present specification relates to a semiconductor device comprising a pair of substrates and liquid crystal held between the pair of substrates, characterized in that a pixel portion and a driver circuit are provided on one of the pair of substrates, and the pixel portion includes:

a semiconductor layer including a source region, a drain region and a channel formation region sandwiched between the source region and the drain region on an insulating surface;

a first insulating film on the semiconductor layer;

an electrode overlapping the channel formation region on the first insulating film;

a source wiring on the first insulating-film;

a second insulating film covering the electrode and the source wiring;

a gate wiring connected to the electrode on the second insulating film;

a connection electrode connected to the source wiring and the semiconductor layer on the second insulating film; and a pixel electrode connected to the semiconductor layer on the second insulating film, and in that the other substrate has a light-shielding film in which a red color filter and a blue color filter are laminated so as to overlap the first semiconductor layer.

Further, in the above-mentioned structure, the semiconductor device provides an IPS-type liquid crystal display device, comprising a common wiring on the second insulating film, wherein the pixel electrode and the common wiring are arranged so that an electric field parallel to a surface of the substrate is generated.

Further, in the above-mentioned structure, there is provided a reflection-type liquid crystal display device in which the pixel electrode is made of a film containing Al or Ag as a main component or a lamination film thereof.

Further, in the above-mentioned structure, the semiconductor device provides a transmission-type liquid crystal display device in which the pixel electrode is made of a transparent electrically conductive film.

Further, as another feature of the present invention, a semiconductor device of the present invention is characterized in that, a first electrode 134 including a gate electrode and a gate wiring 166 are formed on different insulating films, respectively, and the first electrode 134 and a source wiring 137 are formed on a first insulating film, and the gate wiring 166 and a pixel electrode 167 are formed on a second insulating film which is different from the first insulating film.

Further, in a manufacturing process realizing the above-mentioned structure, the structure of the present invention relates to a method of manufacturing a semiconductor device, characterized by comprising:

a first step of forming a semiconductor layer made of a crystalline semiconductor film on an insulating surface;

a second step of forming a first insulating film on the semiconductor layer;

a third step of forming an electrode overlapping the semiconductor layer and a source wiring on the first insulating film;

a fourth step of forming a second insulating film covering the electrode and the source wiring; and a fifth step of forming a gate wiring connected to the electrode and overlapping the semiconductor layer on the second insulating film, a connection electrode for connecting the semiconductor layer to the source wiring, and a pixel electrode overlapping the source wiring.

Further, in a manufacturing process realizing the above-mentioned structure, another structure of the present invention relates to a method of manufacturing a semiconductor device, characterized by comprising:

a first step of forming a first semiconductor layer 172 and a second semiconductor layer 173, each being made of a crystalline semiconductor film, on an insulating surface;

a second step of forming a first insulating film on the first and second semiconductor layers;

a third step of forming a first electrode 134 overlapping the first semiconductor layer, a second electrode 135 overlapping the second semiconductor layer, and a source wiring 137 on the first insulating film;

a fourth step of forming a second insulating film covering the first electrode 134 and the second electrode 135 and the source wiring 137; and a fifth step of forming a gate wiring 166 connected to the first electrode 134 and overlapping the first semiconductor layer 172, a connection electrode 165 for connecting the first semiconductor layer with the source wiring, and a pixel electrode 167 overlapping the source wiring, on the second insulating film.

Further, in the above-mentioned structure, the method is characterized in that the second semiconductor layer connected to the pixel electrode overlaps the second electrode connected to a gate wiring of an adjacent pixel.

BRIEF DESCRIPTION OF THE DRAWINGS

In the accompanying drawings:

FIGS. 7A and 7B are a top view and a cross-sectional view of an active matrix substrate, respectively (Embodiment 3);

FIGS. 8A and 8B are cross-sectional views of a terminal section (Embodiment 3);

DESCRIPTION OF THE PREFERRED EMBODIMENTS

Hereinafter, embodiments of the present invention will be described with reference to the drawings.

A liquid crystal display device of the present invention includes, as a basic structure, an element substrate and a counter substrate bonded with each other with a predetermined gap being interposed therebetween and an electro-optical material (a liquid crystal material or the like) being held in the gap.

Figure 1:
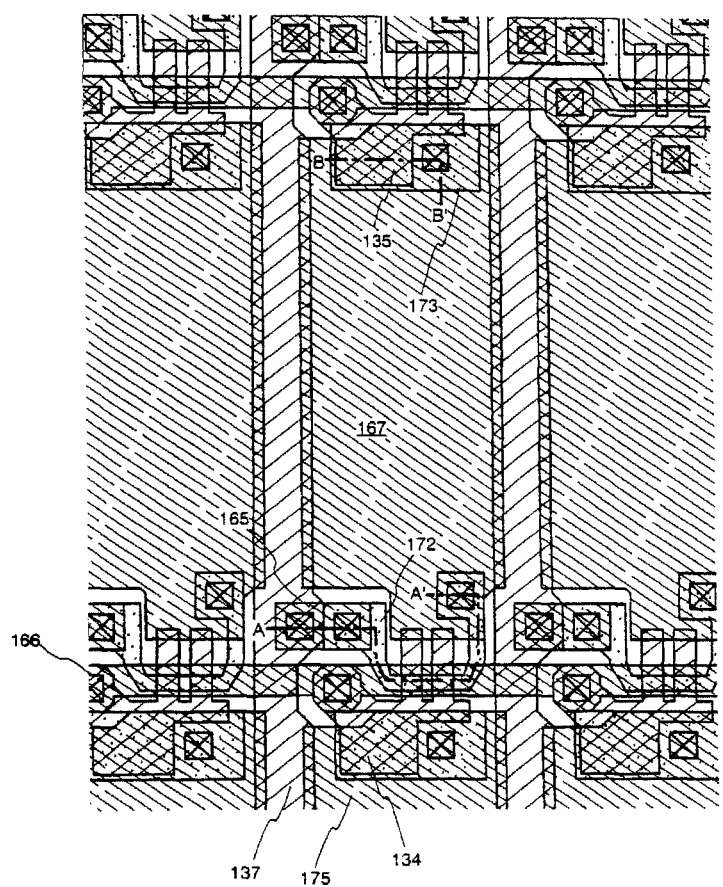
FIG. 1 is a top view of a pixel portion according to the present invention (Embodiment 1)

A specific example of a pixel structure according to the present invention is shown in FIG. 1. Herein, an example of a reflection-type liquid crystal display device is shown.

The element substrate includes a gate wiring 166 arranged in a row direction, a source wiring 137 arranged in a column direction, a pixel portion having a pixel TFT in the vicinity of the intersection of the gate wiring 166 and the source wiring 137; and a driver circuit having an n-channel TFT or a p-channel TFT.

The gate wiring 166 shown in FIG. 1 is a gate wiring connected to an island-like first electrode 134 disposed in a row direction. The gate wiring 166 is provided on a second to insulating film in contact therewith. Similarly with the source wiring 137, the island-like first electrode 134 is formed on a first insulating film (hereinafter, also referred to as a gate insulating film) so as to be in contact therewith.

A connection electrode 165 is formed on the second insulating film (hereinafter, also referred to as an interlayer insulating film) as pixel electrodes 167 and 175 and the gate wiring 166.

Owing to the pixel structure of the present invention, the active layer of the TFT can be placed so as to overlap the gate wiring, thereby shielding the active layer of the TFT from light.

In order to shield the TFT on the electrode substrate from light, at least a channel formation region of a first semiconductor layer 172 is disposed so as to be shielded from light by the gate wiring 166. In addition to the channel formation region, it is desirable that a region present between the channel formation region and the drain region (such as an LDD region and an offset region) and a region present between the channel formation region and the source region are shielded from light by the gate wiring 166. Since the pixel structure shown in FIG. 1 is a multi-gate structure, a plurality of channel formation regions are present in one semiconductor layer. Therefore, a region present between one channel formation region and another channel formation region is also desired to be shielded from light by the gate wiring 166.

The gate wiring 166 is formed on an insulating film in a contacting manner, which is different from the insulating film on which the first electrode 134 serving as a gate electrode is provided. In the pixel structure shown in FIG. 1, the first electrode 134 not only serves as a gate electrode overlapping the first semiconductor layer through the gate insulating film, but also serves as one of the electrodes constituting a storage capacitor of adjacent pixels.

With the pixel structure of the present invention, a region between pixels is shielded from light mainly by overlapping the end of the pixel electrode 167 with the source wiring 137.

Gaps such as a gap between the pixel electrode 167 and the connection electrode 165 and a gap between the pixel electrode 167 and the gate wiring 166 are shielded from light by a color filter provided on the counter substrate. As the color filter, a red color filter, a lamination film of a red color filter and a blue color filter, or a lamination film of a red color filter, a blue color filter and a green color filter, which is patterned to be at a predetermined position (at the position of the TFT on the element substrate), is provided on the counter substrate.

With such a structure, the TFT on the element substrate is shielded from light mainly by the gate wiring 166. Furthermore, the gaps between pixels can be shielded from light by the color filter (a red color filter, a lamination film of a red color filter and a blue color filter, or a lamination film of a red color filter, a blue color filter and a green color filter) provided on the counter substrate.

A storage capacitor of the pixel electrode 167 is constituted by a second semiconductor layer 173 connected to the pixel electrode 167 and a second electrode 135, using an insulating film covering the second semiconductor layer 173 as a dielectric. An impurity element for imparting a p-type conductivity is added to a part of the second semiconductor layer 173. As a result of addition of the impurity element, when a voltage is applied to the second electrode 135, a channel formation region is formed to form a storage capacitor. Furthermore, in a region where the second electrode 135 overlaps the pixel electrode 167, a storage capacitor using the interlayer insulating films 157 and 158 as dielectrics is formed. Although a storage capacitor is herein formed by using the second electrode 135, the storage capacitor is not particularly limited thereto; a pixel structure in which a capacitor wiring or a capacitor electrode is provided may alternatively be employed.

The number of masks required to form the element substrate including the pixel portions having the pixel structure shown in FIG. 1 and driver circuits may be set to five. Specifically, the first mask is for patterning the first semiconductor layer 172 and the second semiconductor layer 173; the second mask is for patterning the first electrode 134, the second electrode 135, and the source wiring 137; the third is a mask for covering an n-channel channel TFT when an impurity element for imparting a p-type conductivity is added so as to form a p-channel TFT and a storage capacitor of the driver circuit; the fourth mask is for forming contact holes reaching the first semiconductor layer, the second semiconductor layer, the first electrode and the second electrode; and the fifth is a mask for patterning the connection electrodes 165 and 205, the gate wiring 166 and the pixel electrodes 167 and 175.

As described above, in the case where the pixel structure shown in FIG. 1 is employed, a reflection-type liquid crystal display device having a high pixel aperture ratio (about 78%) can be realized with the reduced number of masks.

An additional mask is needed if a light-transmitting electrically conductive film is used as a pixel electrode so as to be patterned into a desired shape. However, a transmission-type liquid crystal display device can be manufactured thereby. Also in the case where a transmission-type liquid crystal display device is to be manufactured, a pixel aperture ratio of about 56% can be obtained with the reduced number of masks.

A common wiring and a pixel electrode are arranged so as to generate an electric field parallel to the surface of the substrate, thereby manufacturing a transmission-type liquid crystal display device of the IPS system.

The present invention with the above-described structure will be described in further detail by the following embodiments.

Embodiment 1

A method of manufacturing a pixel portion and TFTs (an n-channel TFT and a p-channel TFT) of a driver circuit formed in the periphery of the pixel portion, at the same time and on the same substrate is explained in detail in Embodiment 1.

Figure 2:
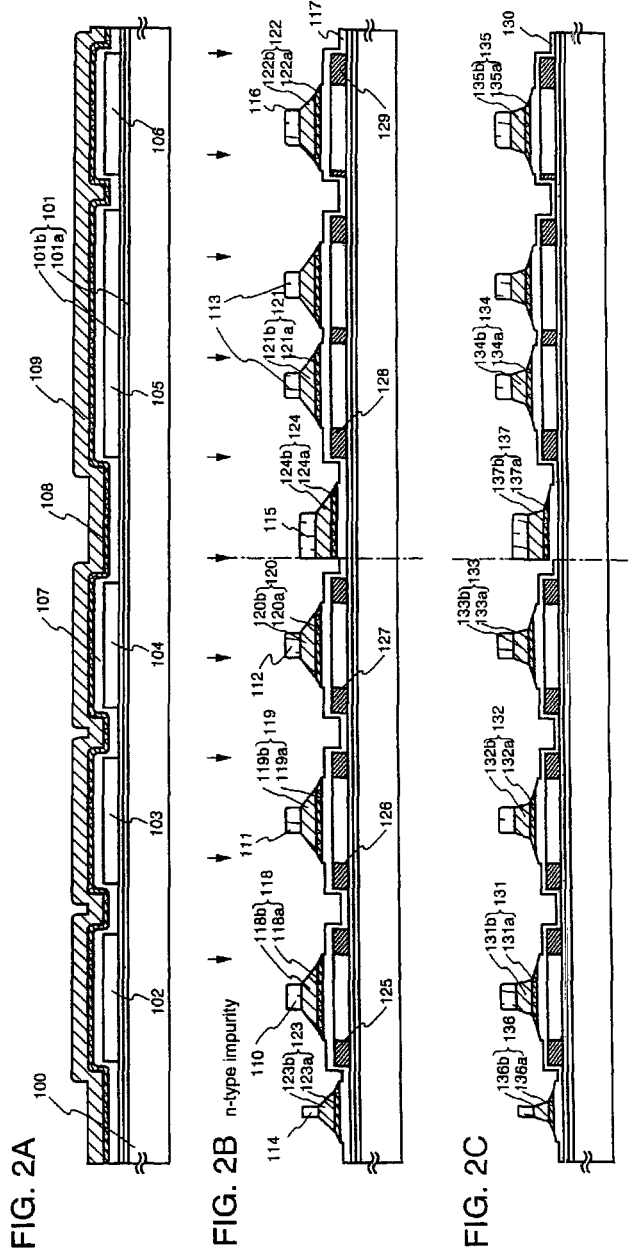
FIGS. 2A to 2C are diagrams showing a manufacturing process of an active matrix substrate (Embodiment 1)

First, as shown in FIG. 2A, a base film 101 made of an insulating film such as a silicon oxide film, a silicon nitride film, or a silicon oxynitride film, is formed on a substrate 100 made from a glass such as barium borosilicate glass or aluminum borosilicate glass, typically a glass such as Corning Corp. #7059 glass or #1737 glass. For example, a lamination film of a silicon oxynitride film 101a, manufactured from $SiH_4$, $NH_3$, and $N_2O$ by plasma CVD, and formed having a thickness of 10 to 200 nm (preferably between 50 and 100 nm), and a hydrogenated silicon oxynitride film 101b, similarly manufactured from $SiH_4$ and $N_2O$, and formed having a thickness of 50 to 200 nm (preferably between 100 and 150 nm), is formed. A two layer structure is shown for the base film 101 in Embodiment 1, but a single layer film of an insulating film, and a structure in which more than two layers are laminated, may also be formed.

Island shape semiconductor layers 102 to 106 are formed by crystalline semiconductor films manufactured from a semiconductor film having an amorphous structure, using a laser crystallization method or a known thermal crystallization method. The thickness of the island shape semiconductor layers 102 to 106 may be formed from 25 to 80 nm (preferably between 30 and 60 nm). There are no limitations placed on the crystalline semiconductor film material, but it is preferable to form the crystalline semiconductor films by silicon or a silicon germanium (SiGe) alloy.

A laser such as a pulse emission type or continuous emission type excimer laser, a YAG laser, or a $YVO_4$ laser can be used as a laser light source used in manufacturing the crystalline semiconductor films by the laser crystallization method. A method of condensing laser light emitted from a laser emission device into a linear shape by an optical system and then irradiating the light to the semiconductor film may be used when these types of lasers are used. The crystallization conditions may be suitably selected by the operator, but when using the excimer laser, the pulse emission frequency is set to 30 Hz, and the laser energy density is set from 100 to 400 ml/cm$^2$ (typically between 200 and 300 mJ/cm$^2$). Further, when using the YAG laser, the second harmonic is used and the pulse emission frequency is set from 1 to 10 kHz, and the laser energy density may be set from 300 to 600 mJ/cm$^2$ (typically between 350 and 500 mJ/cm$^2$). The laser light condensed into a linear shape with a width of 100 to 1000 μm, for example 400 μm, is then irradiated over the entire surface of the substrate. This is performed with an overlap ratio of 80 to 98% for the linear laser light.

A gate insulating film 107 is formed covering the island shape semiconductor layers 102 to 106. The gate insulating film 107 is formed of an insulating film containing silicon with a thickness of 40 to 150 nm by plasma CVD or sputtering. A 120 nm thick silicon to oxynitride film is formed in Embodiment 1. The gate insulating film is not limited to this type of silicon oxynitride film, of course, and other insulating films containing silicon may also be used in a single layer or in a lamination structure. For example, when using a silicon oxide film, it can be formed by plasma CVD with a mixture of TEOS (tetraethyl orthosilicate) and $O_2$, at a reaction pressure of 40 Pa, with, the substrate temperature set from 300 to 400° C., and by discharging at a high frequency (13.56 MHz) electric power density of 0.5 to 0.8 W/cm$^2$. Good characteristics as a gate insulating film can be obtained by subsequently performing thermal annealing, at between 400 and 500° C., of the silicon oxide film thus manufactured.

A first conductive film 108 and a second conductive film 109 are then formed on the gate insulating film 107 in order to form gate electrodes. The first conductive film 108 is formed of a Ta film with a thickness of 50 to 100 nm, and the second conductive film is formed of a W film having a thickness of 100 to 300 nm, in Embodiment 1.

The TaN film is formed by sputtering, and sputtering of a Ta target is performed in a nitrogen atmosphere. The W film is formed by sputtering with a W target, which can also be formed by thermal CVD using tungsten hexafluoride ($WF_6$). Whichever is used, it is necessary to make the film become low resistance in order to use it as the gate electrode, and it is preferable that the resistivity of the W film be made equal to or less than 20 μΩcm. The resistivity can be lowered by enlarging the crystals of the W film, but for cases in which there are many impurity elements such as oxygen within the W film, crystallization is inhibited, and the film becomes high resistance. A W target having a purity of 99.9999% or 99.99% is thus used in sputtering. In addition, by forming the W film while taking sufficient care that no impurities from the gas phase are introduced at the time of film formation, the resistivity of 9 to 20 μΩcm can be achieved.

Note that, although the first conductive film 108 is a Ta film and the second conductive film is a W film in Embodiment 1, the conductive films are not limited to these. Both may also be formed from an element selected from the group consisting of Ta, W, Ti, Mo, Al, and Cu, from an alloy material having one of these elements as its main constituent, or from a chemical compound of these elements. Further, a semiconductor film, typically a poly-silicon film into which an impurity element such as phosphorous is doped, may also be used. Examples of preferable combinations other than that used in Embodiment 1 include: forming the first conductive film by tantalum nitride (TaN) and combining it with the second conductive film formed from a W film; forming the first conductive film by tantalum nitride (TaN) and combining it with the second conductive film formed from an Al film; and forming the first conductive film by tantalum nitride (TaN) and combining it with the second conductive film formed from a Cu film.

Masks 110 to 116 are formed next from resist, and a first etching process is performed in order to form electrodes and wirings. An ICP (inductively coupled plasma) etching method is used in Embodiment 1. A gas mixture of CF, and $Cl_2$ is used as an etching gas, and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias voltage. In case of mixing $CF_4$ and $Cl_2$, the W film and the TaN film are etched to the approximately same level.

Edge portions of the first conductive layer and the second conductive layer are made into a tapered shape in accordance with the effect of the bias voltage applied to the substrate side under the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 118 to 124 (first conductive layers 118*a* to 124*a* and second conductive layers 118*b* to 124*b*) are thus formed of the first conductive layers and the second conductive layers in accordance with the first etching process. Reference numeral 117 denotes a gate insulating film, and the regions of the gate insulating film 117 not covered by the first shape conductive layers 118 to 124 are made thinner by etching of 20 to 50 nm.

Further, the first shape conductive layers 118 to 124 are formed by etching one time to in Embodiment 1, but they may also be formed by a plurality of etchings.

A first doping process is then performed, and an impurity element which imparts n-type conductivity is added. (See FIG. 2B.) Ion doping or ion injection may be performed for the method of doping. Ion doping is performed under the conditions of a dose amount of from $1\times10^{13}$ to $5\times10^{14}$ atoms/cm$^2$ and an acceleration voltage of 60 to 100 keV. A periodic table group 15 element, typically phosphorous (P) or arsenic (As) is used as the impurity element which imparts n-type conductivity, and phosphorous (P) is used here. The conductive layers 118 to 122 become masks with respect to the n-type conductivity imparting impurity element in this case, and first impurity regions 125 to 129 are formed in a self-aligning manner. The impurity element which imparts n-type conductivity is added to the first impurity regions 125 to 129 with a concentration in the range of $1\times10^{20}$ to $1\times10^{21}$ atoms/cm$^3$.

A second etching process is performed next, as shown in FIG. 2C. The ICP etching method is similarly used, a mixture of $CF_4$, $Cl_2$, and $O_3$ is used as the etching gas, and a plasma is generated by supplying a 500 W RF electric power (13.56 MHz) to a coil shape electrode at a pressure of 1 Pa. A 50 W RF electric power (13.56 MHz) is applied to the substrate side (test piece stage), and a self-bias voltage which is lower in comparison to that of the first etching process is applied. The W film is etched anisotropically under these etching conditions, and Ta (the first conductive layers) is anisotropically etched at a slower etching speed, forming second shape conductive layers 131 to 137 (first conductive layers 131*a* to 137*a* and second conductive layers 131*b* to 137*b*). Reference numeral 130 denotes a gate insulating film, and regions not covered by the second shape conductive layers 131 to 137 are additionally etched on the order of 20 to 50 nm, forming thinner regions.

Further, the second shape conductive layers 131 to 137 shown in FIG. 2C are formed by etching one time in Embodiment 1, but they may also be formed by etching twice or more. For example, after performing etching with a gas mixture of $CF_4$ and $Cl_2$, etching may then be performed using a gas mixture of $CF_4$, $Cl_2$ and $O_2$.

The etching reaction of a W film or a TaN film in accordance with a mixed gas of $CF_4$ and $Cl_2$ can be estimated from the radicals generated and from the ion types and vapor pressures of the reaction products. Comparing the vapor pressures of fluorides and chlorides of W and Ta, the W fluoride compound $WF_6$ is extremely high, and the vapor pressures of $WCl_5$, $TaF_5$, and $TaCl_5$ are of similar order. Therefore the W film and the Ta film are both etched by the $CF_4$ and $Cl_2$ gas mixture. However, if a suitable quantity of $O_2$ is added to this gas mixture, $CF_4$ and $O_2$ react, forming CO and F, and a large amount of F radicals or F ions is generated. As a result, the etching speed of the W film having a high fluoride vapor pressure is increased. On the other hand, even if F increases, the etching speed of Ta does not relatively increase. Further, TaN is easily oxidized compared to W, and therefore the surface of TaN is oxidized by the addition of $O_2$. The etching speed of the TaN film is further reduced because TaN oxides do not react with fluorine and chlorine. It therefore becomes possible to have a difference in etching speeds between the W film and the TaN film, and it becomes possible to make the etching speed of the W film larger than that of the TaN film.

Figure 3:
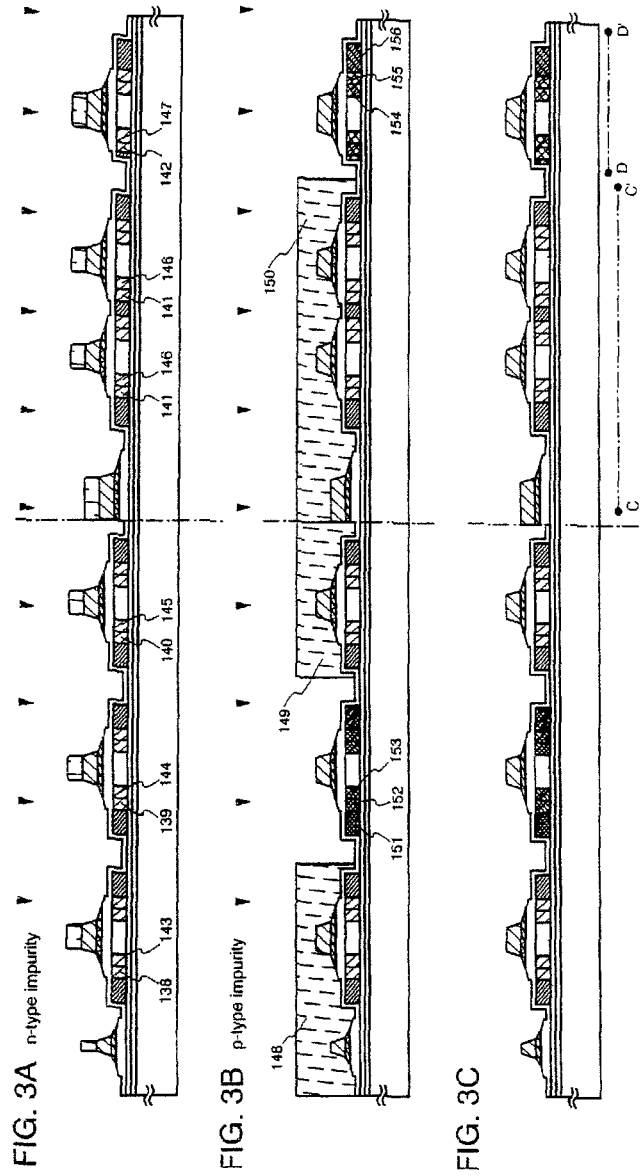
FIGS. 3A to 3C are diagrams showing the manufacturing process of an active matrix substrate (Embodiment 1)

A second doping process is then performed, as shown in FIG. 3A. The dose amount is made smaller than that of the first doping process in this case, and an impurity element which imparts n-type conductivity is doped under high acceleration voltage conditions. For example, doping is performed with the acceleration voltage set from 70 to 120 keV, and a dose amount of $1\times10^{13}$ atoms/cm$^3$, and a new impurity region is formed inside the first impurity region formed in the island shape semiconductor layers of FIG. 2B. The second conductive layers 131b to 135b are used as masks with respect to the impurity element, and doping is performed so as to also add the impurity element into regions under the first conductive layers 131a to 135a. Third impurity regions 143 to 147 that overlap the first conductive layers 131a to 135a, and second impurity regions 143 to 147 between the first impurity regions and the third impurity regions are thus formed. The impurity element which imparts n-type conductivity is added such that the concentration, becomes from $1\times10^{17}$ to $1\times10^{19}$ atoms/cm$^3$ in the second impurity regions, and becomes from $1\times10^{16}$ to $1\times10^{18}$ atoms/cm$^3$ in the third impurity regions.

Further, an example is shown here of performing the second doping process with the resist masks as is, but the second doping process may also be performed after removing the to resist masks.

Fourth impurity regions 151 to 156 added with an impurity element having a conductivity type which is the opposite of the above single conductive type impurity element, are then formed as shown in FIG. 3B in the island shape semiconductor layers 104 which form p-channel TFTs. The second conductive layers 132 and 135 are used as a mask with respect to the impurity element, and the impurity regions are formed in a self-aligning manner. The island shape semiconductor layers 103, 105, and 106, which form n-channel TFTs, are covered over their entire surface areas by resist masks 148 to 150. Phosphorous is added in differing concentration to the impurity regions 151 to 156, and ion doping is performed here using diborane ($B_2H_6$), so that boron is also added to the fourth impurity regions 151 to 156 with a concentration of $2\times10^{20}$ to $2\times10^{21}$ atoms/cm$^3$. In practice, the boron contained in the fourth impurity regions is influenced by the film thickness of the conductive layers which have a tapered shape and the insulating film in positions above the semiconductor layers, similar to the second doping process, and the concentration of the impurity element added into the fourth impurity regions also changes.

Impurity regions are formed in the respective island shape semiconductor layers by the above processes. The second conductive layers 131 to 134 overlapping the island shape semiconductor layers function as gate electrodes. Further, reference numeral 137 denotes the regions functioning as the island shape source wirings, reference numeral 134 denotes the regions functioning as the gate wirings, and reference numeral 135 denotes the regions functioning as the capacitor wirings.

A process of activating the impurity elements added to the respective island shape semiconductor layers is then performed, as shown in FIG. 3C, with the aim of controlling conductivity type. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen atmosphere at 400 to 700° C., typically between 500 and 550° C. Heat treatment is performed for 4 hours at 500° C. in Embodiment 1. However, for cases in which the wiring material used in the wirings 131 to 137 is weak with respect to heat, it is preferable to perform activation after forming an interlayer insulating film (having silicon as its main constituent) in order to protect the wirings and the like.

Figure 5:
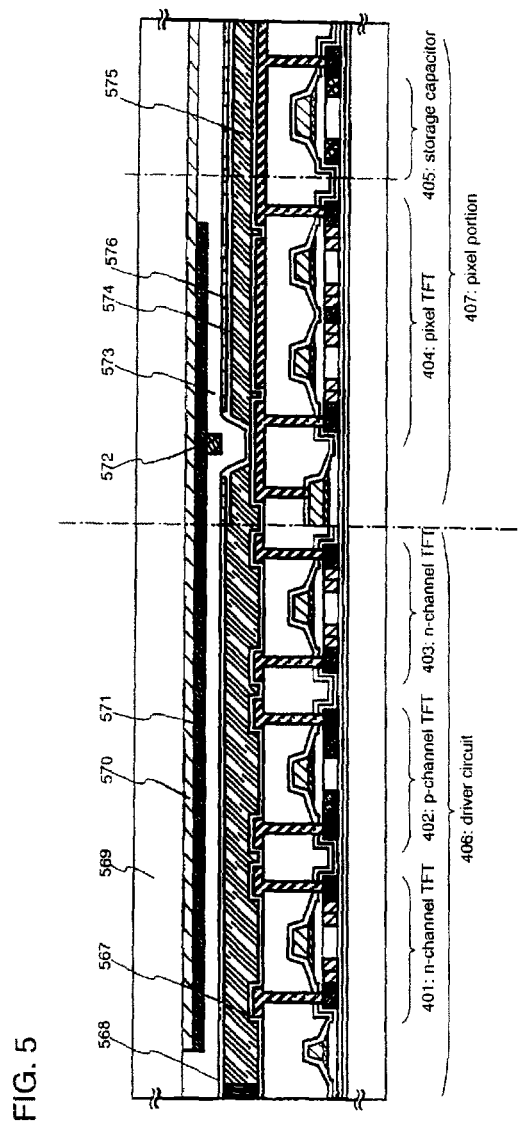
FIG. 5 is a diagram showing a cross-sectional structure of a reflection-type liquid crystal display device (Embodiment 2)
Figure 6:
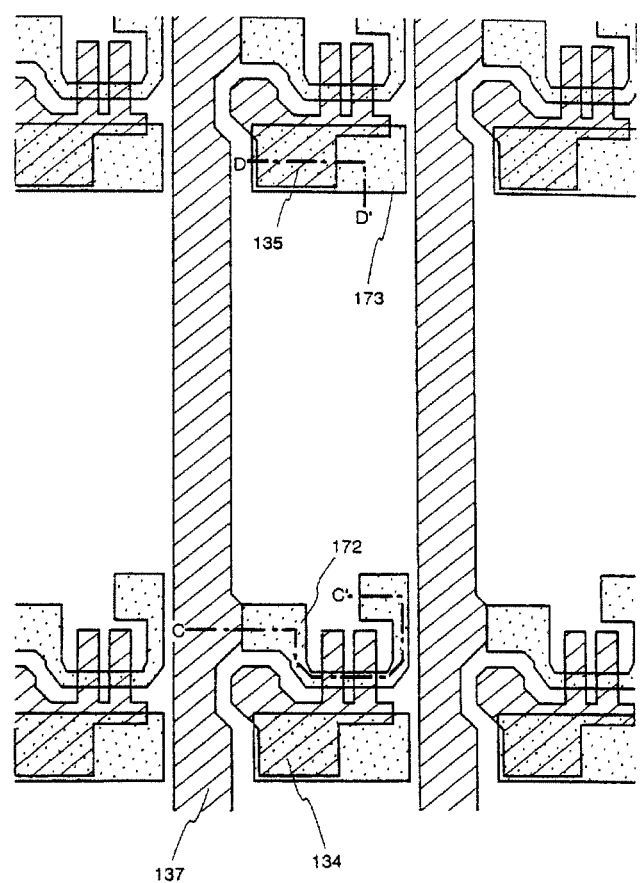
FIG. 6 is a top view of a pixel portion according to the present invention (Embodiment 1)

The top view of the pixel portion after the activation step is shown in FIG. 6. The portions which correspond to FIG. 1 to FIG. 5 are indicated by same marks. The line of C-C' in FIG. 3 correspond to the cross sectional view cut the line C-C' in FIG. 6. The line of D-D' in FIG. 3 correspond to the spherical view cut the line of D-D' in FIG. 6.

In addition, heat treatment is performed for 1 to 12 hours at 300 to 450° C. in an atmosphere containing between 3 and 100% hydrogen, performing hydrogenation of the island shape semiconductor layers. This process is one of terminating dangling bonds in the island shape semiconductor layers by hydrogen which is thermally excited. Plasma hydrogenation (using hydrogen excited by a plasma) may also be performed as another means of hydrogenation.

When the case of using a laser annealing method as a activation process, the laser light such as an YAG laser can be irradiated after forming the protective film from silicon oxinitride film and performing the above mentioned hydrogenation.

A first interlayer insulating film 157 is formed next of a silicon oxynitride film having a thickness of 100 to 200 nm. A second interlayer insulating film 158 made of an organic insulating material is then formed on the first interlayer insulating film 157. Etching is then performed in order to form contact holes.

Source wirings 159 to 161 for forming contacts with source regions, and drain wirings 162 to 164 for forming contacts with drain regions, of the island shape semiconductor layers in a driver circuit 406 are then formed. Further, in a pixel portion 407, pixel electrodes 167, the gate wiring 166 and a connection electrode 165 are formed. (See FIG. 4) An electrical connection is made, in accordance with the connection wiring 165, between the island shape source wiring 137 and a pixel TFT 404. An electrical connection is also made between the gate wiring 166 and the first electrode. The pixel electrode 167 forms electrical connections with the island shape semiconductor layer corresponding to the active layer of the pixel TFT (corresponding to the first semiconductor layer 172 in FIG. 1) and the island shape semiconductor layer forming a storage capacitor (corresponding to the second semiconductor layer 173 in FIG. 1). Note that the pixel electrode 167 is shared between adjacent pixels.

The driver circuit 406 having an n-channel TFT 401, a p-channel TFT 402, and an n-channel TFT 403; and the pixel portion 407 having the pixel TFT 404 and a storage capacitor 405 can thus be formed on the same substrate. For convenience, this type of substrate is referred to as an active matrix substrate throughout this specification.

The n-channel TFT 401 of the driver circuit 406 has: a channel forming region 168; the third impurity region 143 overlapping the second conductive layer 131; which forms a gate electrode, (GOLD (Gate-Overlapped-LDD) region); the second impurity region 141 formed outside the gate electrode (LDD (Lightly-Doped-Drain) region); and the first impurity region 125 which functions as a source region or a drain region. The p-channel TFT 402 has: a channel forming region 169; the fourth impurity region 153 overlapping the second conductive layer 132, which forms a gate electrode; the fourth impurity region 152 formed outside the gate electrode; and the fourth impurity region 151 which functions as a source region or a drain region. The n-channel TFT 403 has: a channel forming region 170; the third impurity region 145 overlapping the second conductive layer 133, which forms a gate electrode, (GOLD region); the second impurity region 140 formed outside the gate electrode (LDD region); and the first impurity region 127 which functions as a source region or a drain region.

Figure 13:
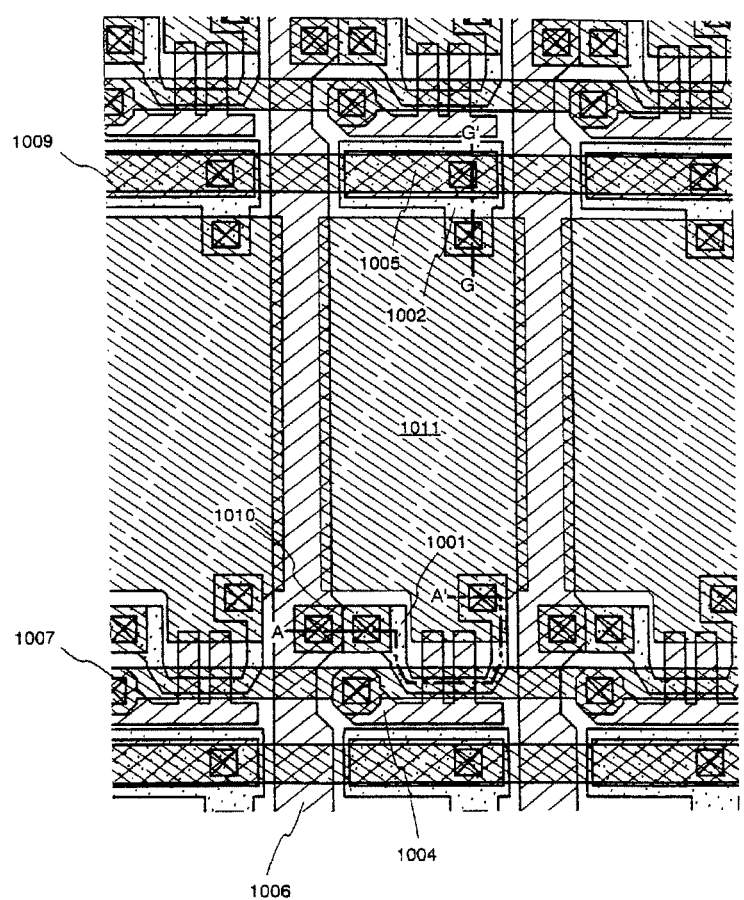
FIG. 13 is a top view of a pixel portion according to the present invention (Embodiment 8)

The pixel TFT 404 of the pixel portion has: a channel forming region 171; the third impurity region 146 overlapping the second conductive layer 139, which forms a gate electrode, (GOLD region); the second impurity region 141 formed outside the gate electrode (LDD region); and the first impurity region 128 which functions as a source region or a drain region. Further, an impurity element which imparts n-type conductivity is added: to the semiconductor layer which functions as one electrode of the storage capacitor 405, at the same concentration as in the forth impurity regions. The storage capacitor 405 is formed by the second electrode 135 and an insulating layer therebetween (the same layer as the gate insulating film). Further, an impurity element which imparts p-type conductivity is added in the semiconductor film 106 because the second electrode 135, which is an electrode of the storage capacitor 405, also functions as a gate electrode of adjacent pixel thin film transistor. Similarly, the first electrode 134 functions as a gate electrode for the pixel electrode 167 and also functions as an electrode of a storage capacitor for the pixel electrode 175. This feature is suitable for a small storage capacitor which is required in a display panel such as 4 inches or less in diagonal. Also, it should be noted that a pixel structure as shown in FIG. 13 is suitable for a large size display panel.

A top view of the pixel portion of the active matrix substrate manufactured by Embodiment 1 is shown in FIG. 1. The portion which correspond to the FIG. 2A to FIG. 6: The line A-A' of FIG. 1 corresponds to the Line A-A' shown in FIG. 4. The line B-B' of FIG. 1 corresponds to the Line B-B' shown in FIG. 6.

Consequently, with the active matrix substrate having the pixel electrode of the present invention, the first electrode 134 a part of which is functioning the gate electrode and the gate wiring 166 are formed in different layers so as to shield from the light the semiconductor film by the gate wiring 166.

Further, with the pixel structure of the present invention, source wirings is arranged so as to overlap in edge portions of the pixel electrodes such that the gaps between the pixel electrodes can be shielded from light without using a black matrix.

Above mentioned pixel structure can make it possible that pixel electrode having large area can be disposed so as to improve the aperture ratio.

Furthermore, in accordance with the processes shown in Embodiment 1, the active matrix substrate can be manufactured by using five photomasks (an island shape semiconductor layer pattern, a first wiring pattern (including the first electrode 134, the second electrode 135, and the source wiring 137), a source and a drain regions of p-channel TFT pattern, a contact hole pattern, and a second wiring pattern (including pixel electrodes 167, connection electrodes 165 and the gate wirings 166). As a result, the processes can be reduced, and this contributes to a reduction in the manufacturing costs and an increase in throughput.

Moreover, although the example where the gate electrode and the source wiring are simultaneously formed is given in this embodiment, another mask may be additionally formed and the gate electrode and the first electrode may be separately formed in different manufacturing steps. Specifically, a portion overlapping the semiconductor layer which is to serve as a gate electrode is first formed. After successively adding an n-type or a p-type impurity element to the portion serving as gate electrode and activating this portion, the first electrode is formed so as to overlap the gate electrode. At this point, a contact between the gate electrode and the first electrode is formed not by forming a contact hole but merely by superposing the first electrode on the gate electrode. Moreover, the source wiring is formed simultaneously with the first electrode. This allows the utilization of aluminum or copper having a low resistance as a material of the first electrode and the source wiring.

Embodiment 2

A process of manufacturing an active matrix liquid crystal display device from the active matrix substrate manufactured in Embodiment 1 is explained below in Embodiment 2. FIG. 5 is used for the explanation.

Figure 4:
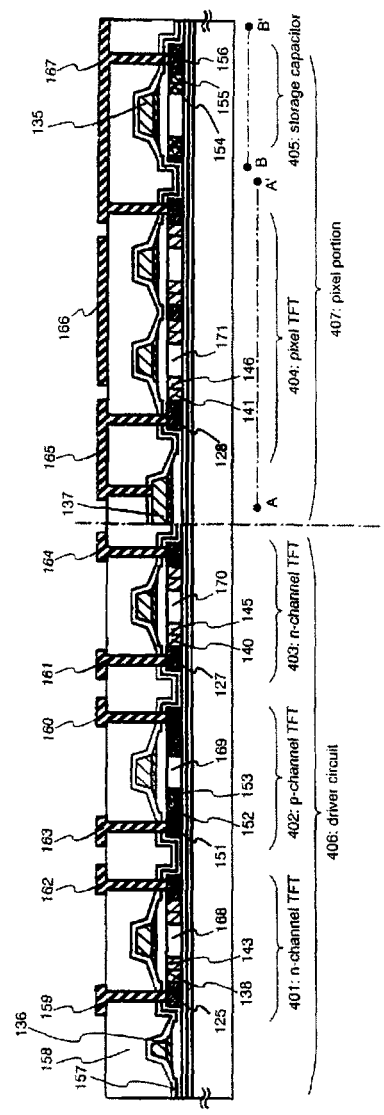
FIG. 4 is a diagram showing the manufacturing process of an active matrix substrate (Embodiment 1)

After first obtaining the active matrix substrate of FIG. 4 in accordance with Embodiment 1, an orientation film 567 is formed on the active matrix substrate of FIG. 4, and a rubbing process is performed.

An opposing substrate 569 is prepared. Color filter layers 570 and 571, and an overcoat layer 573 are formed on the opposing substrate 569. The color filter layers are formed such that the color filter layer 570, having a red color, and the color filter 571, having a blue color, are overlapped with each other, and also serve as a light shielding film. It is necessary to shield at least the spaces between the TFTs, and the connection electrodes and the pixel electrodes when using the substrate of Embodiment 1, and therefore, it is preferable that the red color filters and the blue color filters are arranged so as to overlap and shield the necessary positions.

Further, combined with the connection electrode 165, the red color filter layer 570, the blue color filter layer 571, and a green color filter layer 572 are overlaid, forming a spacer. Each color filter is formed having a thickness of 1 to 3 µm by mixing a pigment into an acrylic resin. A predetermined pattern can be formed using a mask which uses a photosensitive material. Considering the thickness of the overcoat layer of 1 to 4 µm, the height of the spacers can be made from 2 to 7 µm, preferably between 4 and 6 µm. A gap is formed by this height when the active matrix substrate and the opposing substrate are joined together. The overcoat layer is formed by an optical hardening, or a thermosetting, organic resin material, and materials such as polyimide and acrylic resin are used, for example.

The arrangement of the spacers may be determined arbitrarily, and the spacers may be arranged on the opposing substrate so as to line up with positions over the connection electrodes, as shown in FIG. 5, for example. Further, the spacers may also be arranged on the opposing substrate so as to line up with positions over the TFTs of the driver circuit. The spacers may be arranged over the entire surface of the driver circuit portion, and they may be arranged so as to cover source wirings and drain wirings.

An opposing electrode 576 is formed by patterning after forming the overcoat layer 573, and a rubbing process is performed after forming an orientation film 574.

The active matrix substrate on which the pixel portion and the driver circuit are formed, and the opposing substrate are then joined together by a sealant 568. A filler is mixed into the sealant 568, and the two substrates are joined together with a uniform gap maintained by the filler and the spacers. A liquid crystal material 575 is then injected between both the substrate, and this is completely sealed by using a sealing material (not shown in the figure). A known liquid crystal material may be used as the liquid crystal material. The active matrix liquid crystal display device shown in FIG. 5 is thus completed.

Embodiment 3

The structure of the active matrix liquid crystal display device (FIG. 5) obtained by using Embodiment 2 will be described with reference to the top view of FIG. 7A. The components corresponding to those in FIG. 5 are designated by the same reference numerals.

In the top view shown in FIG. 7A, the pixel portion, the driver circuit, an external input terminal 203 to which an FPC (Flexible Printed Circuit) is bonded, a wiring 204 for connecting the external input terminal 203 with input sections of the respective circuits, and the like are formed on an active matrix substrate 201. The active matrix substrate 201 and an opposing substrate 569, on which a color filter and the like are formed, are bonded with each other, sandwiching an end-sealing material 568 therebetween.

A light-shielding film 207 made of a red color filter or a lamination film of a red color filter and a blue color filter is formed on the upper surfaces of a gate wiring side driver circuit 205 and a source wiring side driver circuit 206 that face the counter substrate. A color filter 208 formed on the surface of the pixel portion 407 facing the counter substrate is provided so that each of red (R), green (G) and blue (B) color filters corresponds to each pixel. For practical display, color display is realized by color filters of three colors, i.e., a red color filter, a green color filter and a blue color filter. The arrangement of color filters of these three colors is arbitrary.

FIG. 8A shows a cross sectional view of the external input terminal 203 shown in FIG. 7A taken along the line of F-F'. The external terminal 203 is formed on the side of the active matrix substrate, and is connected to a wiring 211 formed of the same-layer as that of the gate wiring by the wiring 209 formed of the same layer as the pixel electrode for reducing an interlayer capacitor and a wiring resistance to prevent the defects due to breaking of the wiring from occurring, sandwiching the interlayer insulating film 158 therebetween.

The FPC including a base film 212 and a wiring 213 is bonded with the external input terminal by an anisotropic electrically conductive resin 214. Furthermore, mechanical strength is enhanced by a reinforcing plate 215.

FIG. 8B shows the external input terminal 203 in detail, which is a cross-sectional view of the external terminal section shown in FIG. 8A. The external input terminal 203 provided on the side of the active matrix substrate includes the wiring 211 formed of the same layer as that of the first electrode and the source wiring and the wiring 209 formed of the same layer as that of the pixel electrode. It is apparent that it is merely an example showing the structure of the terminal section and that the external terminal section may be constituted by either the wiring 211 or the wiring 209. For example, in the case where the external terminal section is constituted by the wiring 211 formed of the same layer as the first electrode and the source wiring, the interlayer insulating film overlaying the wiring 211 is required to be removed. The wiring 209 made of the same layer as that of the pixel electrode has a triple-layered structure of a Ti film 209a, an Al film 209b and a Sn film 209c. The FPC is formed by the base film 212 and the wiring 213. This wiring 213 and the wiring 209 formed of the same layer as that of the pixel electrode are bonded with each other by an anisotropic electrically conductive adhesive consisting of a thermosetting adhesive 214 and electrically conductive particles 216 dispersed therein, thereby forming an electrical connection structure.

On the other hand, FIG. 7B is a cross-sectional view of the external input terminal 203 shown in FIG. 7A, taken along the line of E-E'. An outer diameter of the electrically conductive particle 216 is smaller than a pitch of the wiring 209. Accordingly, assuming that the amount of the electrically conductive particles 216 dispersed in the adhesive 214 is appropriate, electrical connection with the corresponding wiring on the side of the FPC can be formed without causing short-circuiting with an adjacent wiring.

The active matrix liquid crystal display device manufactured as described above can be used as a display region of various electronic appliances.

Embodiment 4

The active matrix substrate manufactured in Embodiment 1 can be applied to a reflection-type display device without any further manufacturing process. On the other hand, in the case where a transmission-type liquid crystal display device is to be manufactured, a pixel electrode provided for each pixel of the pixel portion may be formed of a transparent electrode. In this embodiment, a method of manufacturing an active matrix substrate used for a transmission-type liquid crystal display device is described with reference to FIGS. 9A to 9C.

Figure 9A:
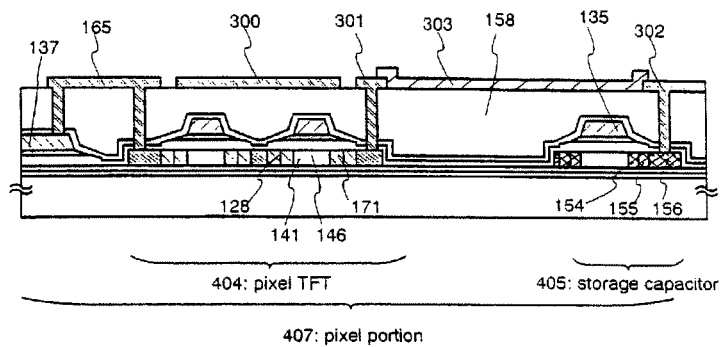
FIGS. 9A to 9C diagrams showing cross-sectional structures of a transmission-type liquid crystal display device (Embodiment 4)

For the manufacture of the active matrix substrate, the manufacturing process up to the formation of a contact hole reaching a semiconductor layer is conducted, following the process of Embodiment 1. Next, the connection electrode 165 for connecting the source wiring 137 and the source region, a gate wiring 300, and a connection electrode 301 for connecting the drain electrode and the pixel electrode are formed (FIG. 9A). These electrodes and wirings are obtained by forming an electrically conductive metal film by sputtering or vacuum evaporation before patterning. The structure is described in detail with reference to FIG. 9B, taking the connection electrode 301 as an example. A Ti film 301a is formed to a thickness of 50 to 150 nm so as to form a contact with a semiconductor layer that forms a source region or a drain region of an island shape semiconductor layer. An Al film 301b is formed to a thickness of 300 to 400 nm so as to overlap the Ti film 301a, and then a Ti film 301c or a titanium nitride (TiN) film is formed thereon to a thickness of 100 to 200 nm so as to obtain a triple-layered structure. Thereafter, a transparent electrically conductive film is formed on the entire surface of the triple-layered structure, and is then subjected to a patterning treatment using a photomask and an etching treatment to form a pixel electrode 303. The pixel electrode 303 is formed on a second interlayer insulating film made of an organic resin material, and has a portion overlapping the connection electrode 301 of a pixel TFT 404 so as not to be through a contact hole, thereby forming an electrical connection.

Alternatively, a connection portion may be formed in the following process. First, a transparent electrically conductive film is formed on a second interlayer insulating film. Then, after a patterning treatment and an etching treatment are conducted to form the pixel electrode, the connection portion is formed so as not to be through the contact hole by forming the connecting electrode in partial contact with the pixel electrode. As a material of the transparent electrically conductive film, indium oxide ($In_2O_5$), an alloy of indium oxide and tin oxide ($In_2O_3$—$SnO_2$; ITO) or the like can be formed by using sputtering, vacuum evaporation or the like. An etching treatment for such materials is conducted by using a hydrochloric acid type solution. Since a residue is likely to be generated in the etching of ITO, an alloy of indium oxide and zinc oxide ($In_2O_3$—ZnO) may alternatively be used to improve the etching processability. Since the alloy of indium oxide and zinc oxide is excellent in surface smoothness as well as in thermal stability as compared with ITO, the use of the alloy of indium oxide and zinc oxide can avoid the Al film 301b from contacting the pixel electrode 303 on the end face of the connection electrode 301 to cause a corrosive reaction. Similarly, zinc oxide is also a suitable material for the transparent electrically conductive film. In addition, zinc oxide to which gallium (Ga) is added (ZnO:Ga) can be used to enhance a transmissivity of visible light and an electrical conductivity.

Figure 9B:
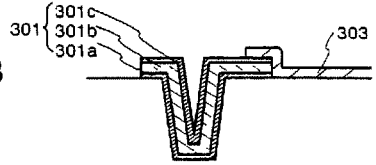
Figure 25:
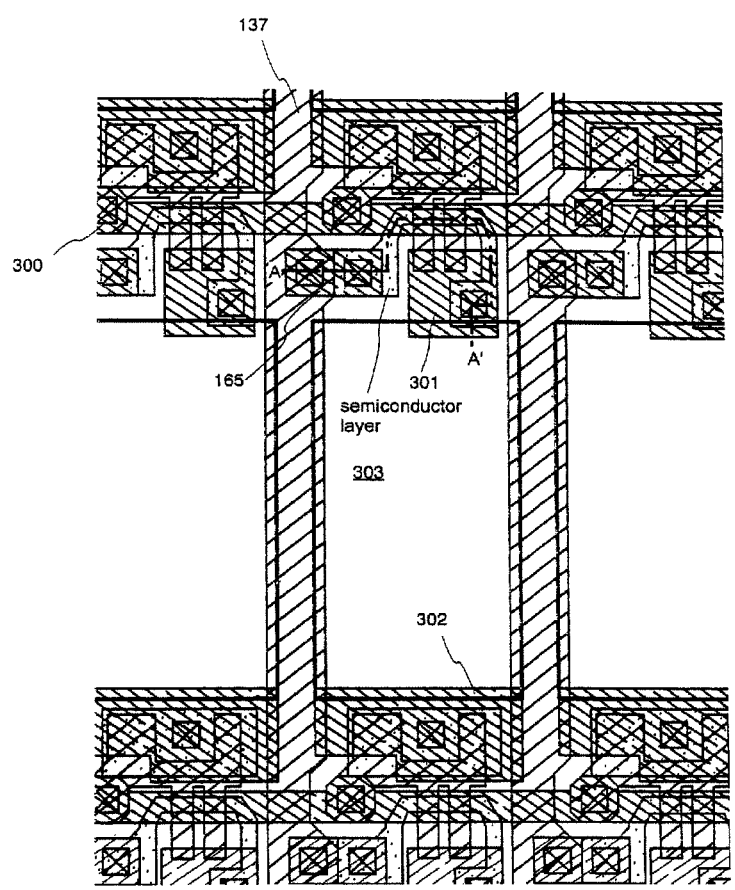
FIG. 25 is a top view of a pixel portion (Embodiment 4).

FIG. 25 is a top view of a pixel. The pixel shown in FIG. 25 has an aperture ratio of about 56%. The components corresponding to those in FIGS. 9A through 9C are denoted by the same reference numerals.

Figure 9C:
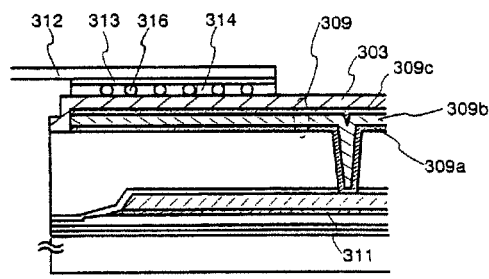

FIG. 9C is a cross-sectional view of an terminal portion of a transmission-type liquid crystal display device. The external input terminal provided on the side of the active matrix substrate includes the wiring 311 made of the same layer as the first electrode and the source wiring and the wiring 309 made of the same layer as the pixel electrode. Certainly, it is merely an example showing the structure of the terminal section; the external input terminal may be formed by either the wiring 133 or the wiring 309. For example, in the case where the external input terminal is formed by the wiring 311 formed of the same layer as the first electrode and the source wiring, the overlaying interlayer insulating film is required to be removed.

The wiring 309 made of the same layer as the pixel electrode has a triple-layered structure of a Ti film 309a, an Al film 309b and a Ti film 309c. A treatment for forming an oxide in the region where Al is exposed is conducted after the formation of the wiring 309, so that the Al film 309b can be prevented from contacting the pixel electrode 303 to cause a corrosive reaction.

The FPC is formed by the base film 312 and the wiring 313. The wiring 313 and the wiring 309 made of the same layer as the pixel electrode are bonded with each other through an anisotropic electrically conductive adhesive made of a thermosetting adhesive 314 and electrically conductive particles 316 dispersed therein, thereby forming an electrical connection structure.

As described above, the active matrix substrate allowing the manufacture of a reflection-type liquid crystal display device is manufactured with five photomasks in Embodiment 1 while an active matrix substrate which can be used for a transmission-type liquid crystal display device can be manufactured with an additional photomask (six photomasks in total). This embodiment is described as conducting the same manufacturing process as that of Embodiment 1; such a structure is applicable to Embodiment 2.

Embodiment 5

Figure 10:
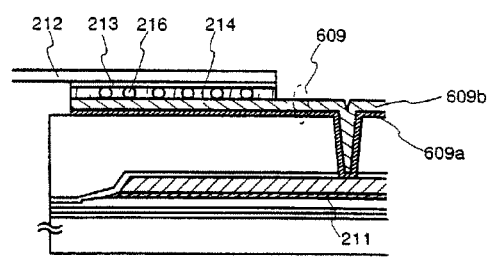
FIG. 10 is a cross-sectional view of a terminal section (Embodiment 5)

In this embodiment, an example where a laminate structure of Ag and Al is used as a second wiring is shown in FIG. 10.

The structure of Embodiment 5 is identical with that of Embodiment 1 except for a second wiring pattern. Only a part different from Embodiment 1 will be described below.

In this embodiment, a laminate structure including Ag of a high reflectance is used as a draw electrode 609. The draw electrode 609 is manufactured simultaneously with a pixel electrode, a connection electrode and a gate wiring that are not shown. A layer 609a is an electrically conductive layer made of Al having a low resistance while a layer 609b is an electrically conductive layer containing Ag as a main component having a high reflectance. Such a combination allows the realization of an active matrix substrate having a high reflectance as well as a low wiring resistance.

This embodiment can be freely combined with any one of Embodiments 1 to 4.

Embodiment 6

Figure 11:
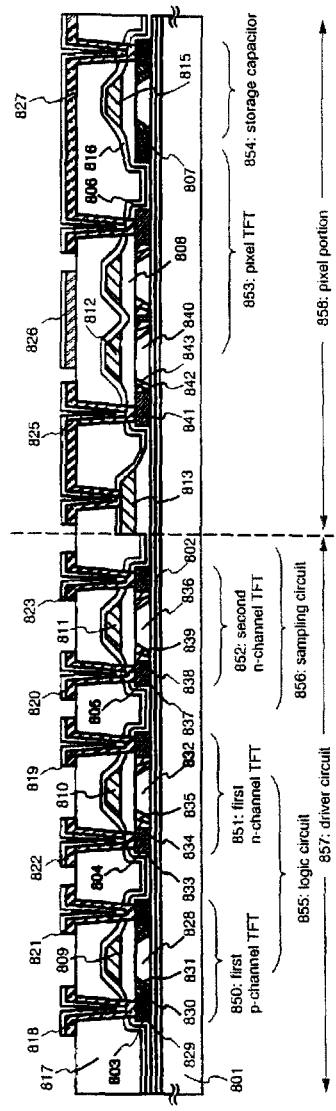
FIG. 11 is a cross-sectional view of an active matrix substrate according to the present invention (Embodiment 6)

An example in which a TFT structure of an active matrix substrate differs from that of Embodiment 1 is explained in Embodiment 6 with reference to FIG. 11.

A driver circuit 857 having a logic circuit portion 855 containing a first p-channel TFT 850 and a second n-channel TFT 851, and a sampling circuit 856 made from a second n-channel TFT 852; and a pixel portion 858 having a pixel TFT 853 and a storage capacitor 854, are formed on the active matrix substrate shown in FIG. 11. The TFT of the logic circuit portion 855 of the driver circuit 857 forms a circuit such as a shift register circuit or a buffer circuit, and the TFT of the sampling circuit 856 basically forms an analog switch.

These TFTs are formed by forming channel forming regions, source regions, drain regions, and LDD regions in island shape semiconductor layers 803 to 806 on a base film 802 formed on a substrate 801. The base film and the island shape semiconductor layers are formed similar to those in Embodiment 1. Gate electrodes 809 to 812 formed on a gate insulating film 808 are formed having a tapered shape in their edge portions, and LDD regions are formed using these portions. This type of tapered shape can be formed by an anisotropic etching technique of a W film using an ICP etching apparatus, similar to Embodiment 1. Further, a source wiring 813 and a second electrode (capacitor electrode) 815 have a tapered shape.

The LDD regions formed utilizing the tapered portions are formed in order to increase reliability of n-channel TFTs, and on-current degradation due to the hot carrier effect is prevented by the LDD regions. Regarding the LDD regions, ions of the impurity element are accelerated by an electric field and added to semiconductor films through edge portions of the gate electrode, and through the gate insulating film in the vicinity of the edge portions, by ion doping method.

A first LDD region 835, a second LDD region 834, and a source or drain region 833 are formed outside a channel forming region 832 in the first n-channel TFT 851, and the first LDD region 835 is formed so as to overlap the gate electrode 810. Further, an n-type impurity element contained in the first LDD region 835 and the second LDD region 834 is higher in the second LDD region 834 due to the difference in the film thickness of the upper layer gate insulating film and the gate electrode. The second n-channel TFT 852 is also formed having a similar structure, and is composed of a channel forming region 836, a first LDD region 839 overlapping the gate electrode, a second LDD region 838, and a source or drain region 837. On the other hand, the p-channel TFT 850 has a single drain structure, and impurity regions 829 to 831, in which a p-type impurity is added to the outside of a channel forming region 828, are formed.

The pixel TFT formed of an n-channel TFT in the pixel portion 858 is formed by a multi-gate structure with the aim of reducing the off current, and a first LDD region 843 overlapping the gate electrode, a second LDD region 842, and a source or drain region 841 are formed outside a channel forming region 840. Further, the storage capacitor 854 is formed from an island shape semiconductor layer 807, an insulating layer formed from the same layer as the gate insulating film 808, and a second electrode 815. A p-type impurity is added to the island shape semiconductor layer 807, and the voltage applied to the second electrode can be made lower due to the low resistivity.

An interlayer insulating film is formed of a first interlayer insulating film 816 having a thickness of 50 to 500 nm and made from an inorganic material such as silicon oxide, silicon nitride, or silicon oxynitride, and a second interlayer insulating film 817 made from an organic insulating material such as polyimide, acrylic, polyimide amide, or BCB (benzocyclobutene). A well leveled surface can thus be obtained by forming the second interlayer insulating film with an organic insulating material. Further, organic resin materials generally have low dielectric constants, and therefore parasitic capacitance can be reduced. However, organic resin materials are hygroscopic and not suitable as protective films. It is therefore preferable to form the second interlayer insulating film in combination with the first interlayer insulating film 816.

A resist mask having a predetermined pattern is formed next, and contact holes for reaching source regions or drain regions of the respective island shape semiconductor layers are formed. The contact holes are formed by dry etching. A mixed gas of $CF_4$, $O_2$, and He is used as an etching gas in this case, and the interlayer insulating film made from the organic resin material is etched first. The protecting insulating film is etched next with $CF_4$ and $O_2$ as an etching gas. In addition, by switching the etching gas to CHF, in order to increase the selectivity with respect to the island shape semiconductor layers, the gate insulating film is etched. Thus, good contact holes can be formed.

A conductive metallic film is then formed by sputtering or vacuum evaporation, a resist mask pattern is formed, and source and drain wirings 818 to 823, a pixel electrode 827, a gate wiring 826 and a connection electrode 825 are formed by etching. An active matrix substrate having the pixel portion with the pixel structure as shown in FIG. 1 can thus be formed. Furthermore, the active matrix liquid crystal display device shown in Embodiment 2 can be manufactured by using the active matrix substrate of Embodiment 6.

Moreover, although the example where the gate electrode and the source wiring are simultaneously formed is given in this embodiment, another mask may be additionally formed and the gate electrode and the first electrode may be separately formed in different manufacturing steps. Specifically, a portion overlapping the semiconductor layer which is to serve as a gate electrode is first formed. After successively adding an n-type or a p-type impurity element to the portion serving as gate electrode and activating this portion, the first electrode is formed so as to overlap the gate electrode. At this point, a contact between the gate electrode and the first electrode is formed not by forming a contact hole but merely by superposing the first electrode on the gate electrode. Moreover, the source wiring is formed simultaneously with the first electrode. This allows the utilization of aluminum or copper having a low resistance as a material of the first electrode and the source wiring.

Embodiment 7

Figure 12:
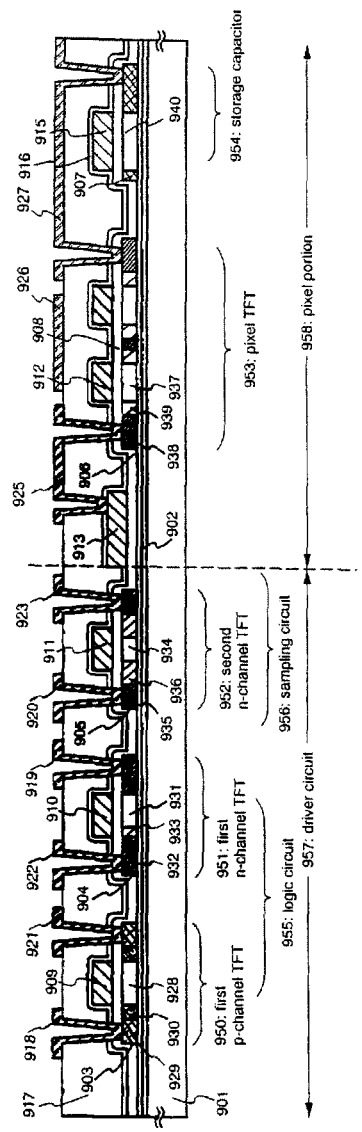
FIG. 12 is a cross-sectional view of an active matrix substrate according to the present invention (Embodiment 7)

Another example in which a TFT structure of an active matrix substrate differs from that of Embodiment 1 is explained in Embodiment 7 with reference to FIG. 12.

A driver circuit 957 having a logic circuit portion 955 comprising a first p-channel TFT 950 and a second n-channel TFT 951, and a sampling circuit portion 956 formed of a second n-channel TFT 952; and a pixel portion 958 having a pixel TFT 953 and a storage capacitor 954, are formed on the active matrix substrate shown in FIG. 12. The TFT of the logic circuit portion 955 of the driver circuit 957 forms a circuit such as a shift register circuit or a buffer circuit, and the TFT of the sampling circuit 956 basically forms an analog switch.

For the active matrix substrate shown in Embodiment 7, a base film 902 is first formed on a substrate 901, of a film such as a silicon oxide film or a silicon oxynitride film, having a thickness of 50 to 200 nm. Island shape semiconductor layers 903 to 907 are formed next from a crystalline semiconductor film manufactured by laser crystallization or thermal crystallization. A gate insulating film 908 is formed on the island shape semiconductor layers. An impurity element which imparts n-type conductivity, typically phosphorous (P) is then selectively added to the island shape semiconductor layers 904 and 905, which form n-channel TFTs, and to the island shape semiconductor layer 907, which forms a storage capacitor, at a concentration of $1 \times 10^{16}$ to $1 \times 10^{19}$ atoms/cm$^3$.

Gate electrodes 909 to 912, a second electrode (capacitor electrode) 915, and a source wiring 913 are formed by a material having W or TaN as a constituent. The gate electrode, the second electrode, and the source wiring may also be separately formed by a material having a low resistivity such as Al. An impurity element which imparts n-type conductivity, typically phosphorous (P) is then selectively added at a concentration of $1 \times 10^{19}$ to $1 \times 10^{21}$ atoms/cm$^3$ to regions outside the island shape semiconductor layers 903 to 907, outside the gate electrodes 909 to 912, and outside the second electrode 915. Channel forming regions 931 and 934, LDD regions 933 and 936, and source or drain regions 932 and 935 are thus formed in the first n-channel TFT 951 and in the second n-channel TFT 952, respectively. An LDD region 939 of the pixel TFT 953 is formed in a self-aligning manner using the gate electrode 912, and is formed outside a channel forming region 937. A source or drain region 938 is formed similar to the first and the second n-channel TFTs.

An interlayer insulating film is formed, similar to Embodiment 3, of a first interlayer insulating film 916 made from an inorganic material such as silicon oxide, silicon nitride, or silicon oxynitride, and a second interlayer insulating film 917 made from an organic insulating material such as polyimide, acrylic, polyimide amide, or BCB (benzocyclobutene). A resist mask having a predetermined pattern is formed next, and contact holes for reaching source regions or drain regions formed in the respective island shape semiconductor layers are formed. A conductive metallic film is then formed by sputtering or vacuum evaporation, and source wirings and drain wirings 918 to 923, a pixel electrode 927, a gate wiring 926, and a connection electrode 925 are formed, An active matrix substrate having the pixel portion with the pixel structure shown in FIG. 1 can thus be formed. Further, the active matrix liquid crystal display device shown in Embodiment 2 can also be manufactured using the active matrix substrate of Embodiment 7.

The first n-channel TFT 951 of the logic circuit portion 955 has a structure in which a GOLD region overlapping the gate electrode is formed on the drain side. High electric field regions generated in the vicinity of the drain region are relieved by the GOLD region, hot carrier generation is prevented, and degradation of the TFT can be prevented. An n-channel TFT having this type of structure is suitable in buffer circuits and shift register circuits. On the other hand, the second n-channel TFT 952 of the sampling circuit portion 956 has a structure in which a GOLD region and an LDD region are formed on the source side and on the drain side, which prevents deterioration due to hot carriers in an analog switch that operates by polarity inversion. In addition, this structure aims to reduce the off current. The pixel TFT 953 has an LDD structure, and is formed by multiple gates, and a structure thereof aims to reduce the off current. On the other hand, the p-channel TFT is formed with a single drain structure, and impurity regions 929 and 930, into which a p-type impurity element is added, are formed outside a channel forming region 928.

The TFTs structuring each circuit are thus optimized in response to the specification required by the pixel portion and the driver circuit, and the active matrix substrate shown in FIG. 12 has a structure which, in particular, is made in, consideration of increasing the operating characteristics and reliability of each circuit.

Moreover, although the example where the gate electrode and the source wiring are simultaneously formed is given in this embodiment, another mask may be additionally formed and the gate electrode and the first electrode may be separately formed in different manufacturing steps. Specifically, a portion overlapping the semiconductor layer which is to serve as a gate electrode is first formed. After successively adding an n-type or a p-type impurity element to the portion serving as gate electrode and activating this portion, the first electrode is formed so as to overlap the gate electrode. At this point, a contact between the gate electrode and the first electrode is formed not by forming a contact hole but merely by superposing the first electrode on the gate electrode. Moreover, the source wiring is formed simultaneously with the first electrode. This allows the utilization of aluminum or copper having a low resistance as a material of the first electrode and the source wiring.

Embodiment 8

Figure 14:
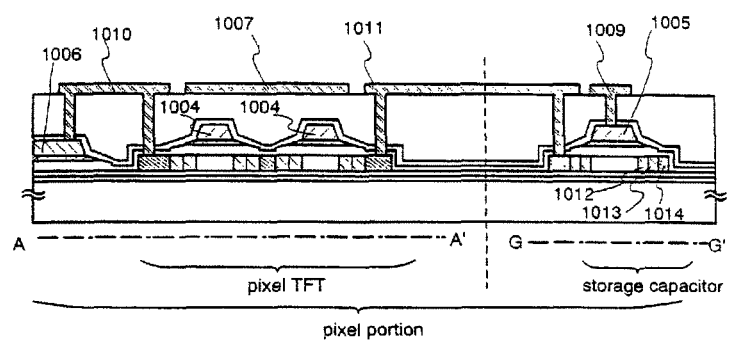
FIG. 14 is a cross-sectional view of the pixel portion according to the present invention (Embodiment 8)

In this embodiment, a pixel structure different from that shown in FIG. 1 is shown in FIG. 13. A cross-sectional structure thereof is shown in FIG. 14, illustrating a cross section taken along the line of A-A' and a cross-section taken along the line of G-G'. Only the structure of a storage capacitor is different from that of Embodiment 1, and the structure of this embodiment other than the storage capacitor is substantially identical with that of Embodiment 1.

In this embodiment, the storage capacitor is formed by a second semiconductor layer 1002 and a capacitor electrode 1005 using an insulating film on the second semiconductor layer 1002 as a dielectric. A first semiconductor layer is denoted by the reference numeral 1001. The capacitor electrode 1005 is connected to a storage wiring 1009. The capacitor electrode 1005 is formed simultaneously with the first electrode 1004 and the source wiring 1006 on the same insulating film. Moreover, the capacitor wiring is formed simultaneously with the pixel electrode 1011, the connection electrode 1010 and the gate wiring 1007 on the same insulating film.

In this embodiment, an impurity element for imparting an n-type conductivity is added to impurity regions 1012 through 1014, as in the pixel TFT. This structure can be applied even for a large size display panel such as 10 inches or more in diagonal.

Moreover, although the example where the gate electrode and the source wiring are simultaneously formed is given in this embodiment, another mask may be additionally formed and the gate electrode, the first electrode and the capacitor wiring may be separately formed in different manufacturing steps. Specifically, a portion overlapping the semiconductor layer which is to serve as a gate electrode is first formed. After successively adding an n-type or a p-type impurity element to the portion serving as gate electrode and activating this portion, the first electrode is formed so as to overlap the gate electrode. At this point, a contact between the gate electrode and the first electrode is formed not by forming a contact hole but merely by superposing the first electrode on the gate electrode. Moreover, the source wiring and the capacitor wiring are formed simultaneously with the first electrode. This allows the utilization of aluminum or copper having a low resistance as a material of the first electrode and the source wiring. Furthermore, an n-type or p-type impurity element is added to the portion of the semiconductor layer overlapping the capacitor wiring to increase a storage capacitor.

According to this embodiment, the active matrix substrate can be manufactured by altering the mask design of Embodiment 1 without increasing the number of masks.

This embodiment can be freely combined with any one of Embodiments 1 to 5.

Embodiment 9

Embodiment 9 represents another method of fabricating the crystalline semiconductor layer for forming the semiconductor layer of the TFT of the active matrix substrate represented by Embodiment 1. In this embodiment, the crystallization method using a catalytic element, that is disclosed in Japanese Patent Laid-Open No. 7-130652, can be applied. An example of this case will be explained below.

Base films and an amorphous semiconductor layer are formed to a thickness of 25 to 80 nm on a glass substrate in the same way as in Embodiment 1. An amorphous silicon film, for example, is formed to a thickness of 55 nm. An aqueous solution containing 10 ppm, calculated by weight, of a catalytic element is applied by a spin coating method to form a layer containing the catalytic element. Examples of the catalytic element include nickel (Ni), germanium (Ge), iron (Fe), palladium (Pd), tin (Sn), lead (Pb), cobalt (Co), platinum (Pt), copper (Cu) and gold (Au). Besides spin coating, the layer 170 containing the catalytic element may be formed by sputtering or vacuum deposition so that the thickness of the layer of the catalytic element is 1 to 5 nm.

In the crystallization step, heat treatment is conducted first at 400 to 500° C. for about 1 hour and the hydrogen content of the amorphous silicon film is lowered to not greater than 5 atom %. Heat annealing is then conducted in a nitrogen atmosphere at 550 to 600° C. for 1 to 8 hours inside a furnace annealing oven. The crystalline semiconductor layer comprising the crystalline silicon film can be obtained in accordance with the above mentioned process.

By forming the island semiconductor layers from the crystalline semiconductor layers manufactured as above mentioned, an active matrix substrate can be completed, similarly to Embodiment 1. However, in crystallization process, if a catalytic element for promoting to the crystallization of silicon is used, a small amount (about $1\times10^{17}$ to $1\times10^{19}$ atoms/$cm^3$) of the catalytic element remains within the island semiconductor layers. It is, of course, possible to complete the TFT in such a state, but it is preferred to remove the remaining catalytic element from at least the channel forming region. One of the means of removing this catalytic element is a means using gettering effect of phosphorous (P).

A gettering treatment with phosphorus (P) for this purpose can be conducted simultaneously with the activation step explained in FIG. 3C. The concentration of phosphorus (P) necessary for gettering may be approximate to the impurity concentration of the high concentration n-impurity region. Thermal annealing of the activation step can allow the catalytic element to segregate from the channel formation region of the n-channel TFT and the p-channel TFT to the impurity region containing phosphorus (P) in that concentration. As a result, the catalytic element segregates in a concentration of $1 \times 10^{17}$ to $1 \times 10^{19}$ atoms/cm$^3$ in the impurity region. The TFT thus fabricated has a lowered OFF current value and has high crystallinity. Therefore, a high field effect mobility can be obtained, and excellent characteristics can be accomplished.

This embodiment can be freely combined with one of the structure of Embodiments 1 to 8.

Embodiment 10

Figure 15:
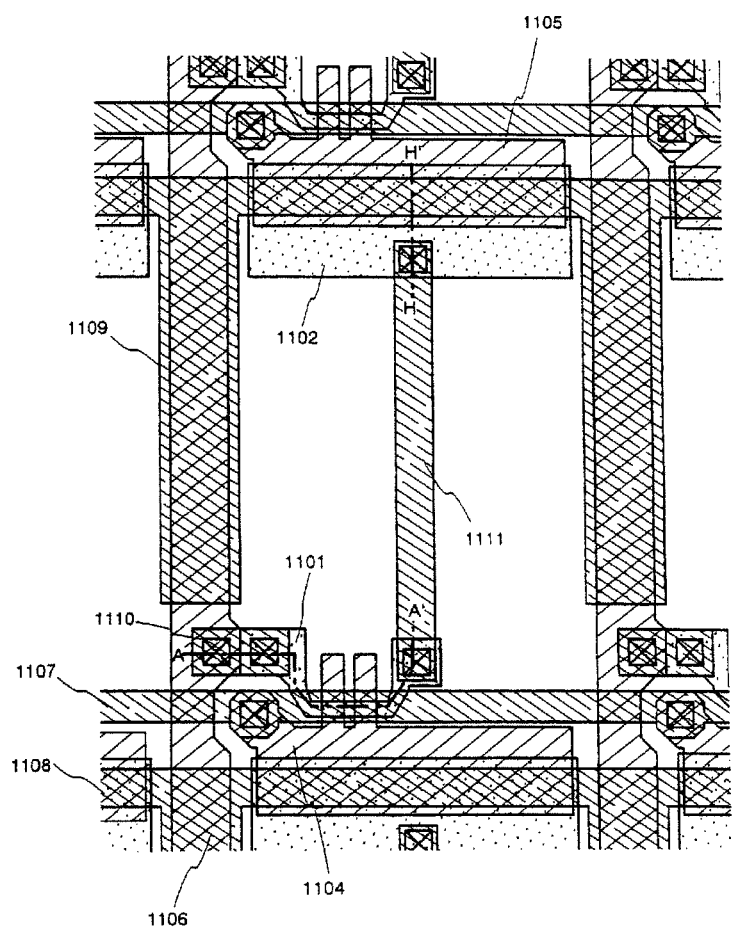
FIG. 15 is a top view of a pixel portion according to the present invention (Embodiment 10)

In this embodiment, a pixel structure (IPS system) different from that of Embodiment 1 is shown in FIG. 15. A cross-sectional structure thereof is shown in FIG. 16, illustrating a cross section taken along the line of A-A' and a cross-section taken along the line of H-H'.

This embodiment shows an example of an active matrix liquid crystal display device of an IPS (In-Plane Switching) system (also referred to as a horizontal electric field system). The IPS system is characteristic in that a pixel electrode and a common wiring are both formed on one of a pair of substrates and that an electric field is applied in a horizontal direction. As a result, the longitudinal axes of liquid crystal molecules are controlled to be oriented substantially parallel to the surface of the substrate. The utilization of the IPS system allows a viewing angle to be increased.

In FIG. 15, a first semiconductor layer is denoted by the reference numeral 1101, second semiconductor layer by 1102, a first electrode by 1104, a second electrode by 1105, a source wiring by 1106, a gate wiring by 1107, common wirings by 1108 and 1109, a connection electrode by 1110, and a pixel electrode by 1111. The pixel electrode 1111 and the common wirings 1108 and 1109 are placed so that an electric field parallel to the surface of the substrate is generated. The common wirings 1108 and 1109 are placed so as to overlap the source wiring 1106, resulting in improvement of the aperture ratio of the pixel portion.

Figure 16:
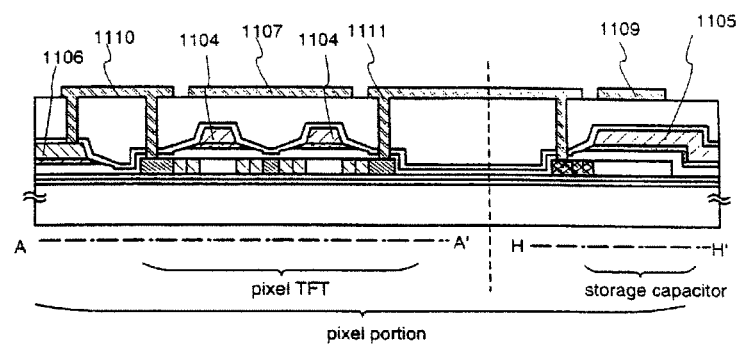
FIG. 16 is a cross-sectional view of the pixel portion according to the present invention (Embodiment 10)

As shown in FIG. 16, the first electrode 1104, the second electrode 1105 and the source wiring 1106 are simultaneously formed on the insulating film covering the first semiconductor layer 1101 and the second semiconductor layer 1102. The pixel electrode 1111, the connection electrode 1110, the gate wiring 1107 and the common wiring 1109 are simultaneously formed on the interlayer insulating film covering the source wiring 1106.

The first electrode 1104 is electrically connected to the gate wiring 1107. The first electrode 1104 overlapping the first semiconductor layer 1101 functions as a gate electrode.

Although the oblong-shaped pixel electrode is shown in this embodiment, the pixel electrode and a common electrode may have a V-shaped electrode structure to further increase a viewing angle. The storage capacitor is formed by the second semiconductor layer 1102, the insulating film covering the second semiconductor layer 1102, and the second electrode 1105. The second electrode 1105 is electrically connected to a gate wiring of the adjacent pixel. Moreover, an impurity element for imparting a p-type conductivity is added to the second semiconductor layer 1102.

The pixel structure of this embodiment can be obtained by the same manufacturing process as that of Embodiment 1 with the change in the mask pattern of Embodiment 1.

After the state shown in FIGS. 15 and 16 are obtained by using Embodiment 1, a liquid crystal display device is obtained by the method described in Embodiment 2. The gap between pixels is shielded from light by using a color filter provided on the counter substrate in a similar manner as in Embodiment 2. However, since the IPS system is employed, it is necessary to alter an orientation treatment and the like.

Embodiment 11

Figure 17:
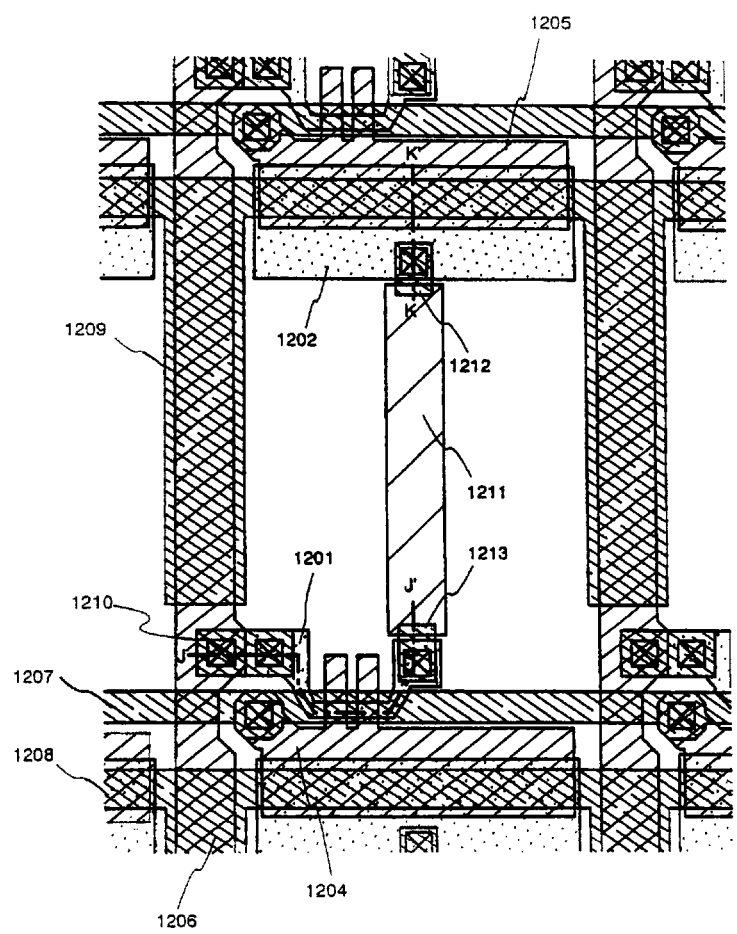
FIG. 17 is a top view of a pixel portion according to the present invention (Embodiment 11)
Figure 18:
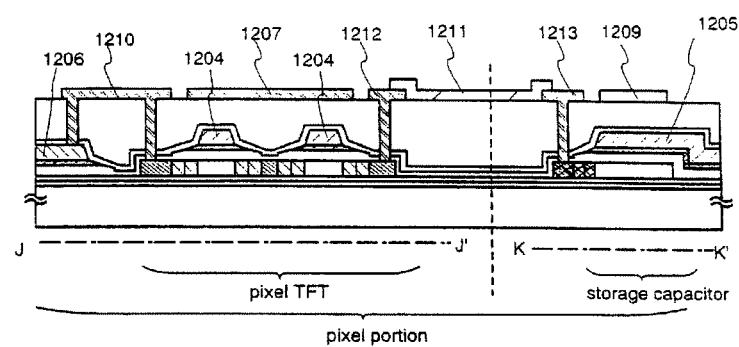
FIG. 18 is a cross-sectional view of the pixel portion according to the present invention (Embodiment 11)

In this embodiment, a pixel structure of the IPS system different from that of Embodiment 10 is shown in FIG. 17. A cross-sectional structure thereof is shown in FIG. 18, illustrating a cross section taken along the line J-J' and a cross-section taken along the line K-K'. Only the structure of a pixel electrode of this embodiment is different from that of Embodiment 10, and the structure other than the pixel electrode is substantially identical with that of Embodiment 10.

In FIG. 17, a first semiconductor layer is denoted by the reference numeral 1201, second semiconductor layer by 1202, a first electrode by 1204, a second electrode by 1205, a source wiring by 1206, a gate wiring by 1207, common wirings by 1208 and 1209, a first connection electrode by 1210, a pixel electrode by 1211, and second connection electrodes by 1212 and 1213. The pixel electrode 1211 and the common wirings 1208 and 1209 are placed so that an electric field parallel to the surface of the Substrate is generated. As the pixel electrode 1211, an electrically conductive film (an ITO film or the like) having a light transmittance is used. An additional mask is provided for patterning of the electrically conductive film having a light transmittance, so that second connection electrode overlaps the pixel electrode to allow electrical connection. An electrically conductive film having a light transmittance is used as the pixel electrode to improve an aperture ratio. Moreover, the common wirings 1208 and 1209 are placed so as to overlap the source wiring 1206 to improve an aperture ratio of the pixel portion.

As shown in FIG. 18, the first electrode 1204, the second electrode 1205, the source wiring 1206 are simultaneously formed on the insulating film covering the first semiconductor layer 1201 and the second semiconductor layer 1202: Moreover, the first connection electrode 1210, the gate wiring 1207, the common wiring 1209, and the second connection electrodes 1213 and 1212 are simultaneously formed on the interlayer insulating film covering the source wiring 1206.

The first electrode 1204 is electrically connected to the gate wiring 1207, and a portion of the first electrode 1204 overlapping the first semiconductor layer 1201 functions as a gate electrode.

Although the oblong-shaped pixel electrode is shown in this embodiment, the pixel electrode 1211 and a common electrode may have a V-shaped electrode structure to further increase a viewing angle.

The storage capacitor is formed by the second semiconductor layer 1202, the insulating film covering the second semiconductor layer 1202 and the second electrode 1205. The second electrode 1205 is electrically connected to the gate wiring of an adjacent pixel. Moreover, an impurity element for imparting a p-type conductivity is added to the second semiconductor layer 1202.

The pixel structure of this embodiment can be obtained in the same manufacturing process as that of Embodiment 1 if the mask pattern of Embodiment 1 is changed.

After the state shown in FIGS. 15 and 16 is obtained by using Embodiment 1, a liquid crystal display device is obtained by the method described in Embodiment 2. The gap between pixels is shielded from light by using a color filter provided on a counter substrate as in Embodiment 2. However, since the IPS system is employed in this embodiment, it is necessary to alter an orientation treatment and the like.

Embodiment 12

Figure 19:
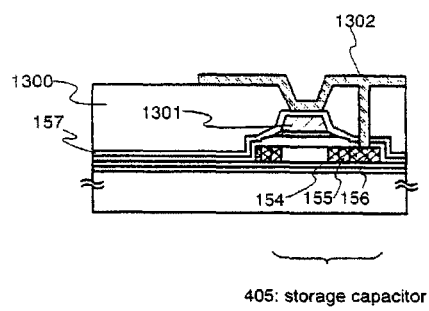
FIG. 19 is a cross-sectional view of a pixel portion according to the present invention (Embodiment 12)

In this embodiment, a cross-sectional structure of a storage capacitor, different from that of Embodiment 1 is shown in FIG. 19. Only the structure of a storage capacitor of this embodiment is different from that of Embodiment 1, and the structure other than the storage capacitor is substantially identical with that of Embodiment 1. The components designated by the same reference numerals as those of Embodiment 1 correspond to the components of Embodiment 1.

First, after the state where the interlayer insulating film 157 is formed is obtained following the manufacturing process of Embodiment 1, an additional mask is provided for selective etching so as to partially remove the interlayer insulating film 157. As a result of selective etching, an interlayer insulating film 1300 made of an organic resin and the interlayer insulating film 157 are selectively left. Next, a pixel electrode 1302 is formed thereon.

As in Embodiment 1, a storage capacitor is formed by the semiconductor film including the impurity regions 154 to 156 and a capacitor electrode 1301, using the first insulating film as a dielectric in this example. Additionally, another storage capacitor is formed by the capacitor electrode 1301 and the pixel electrode 1302, using the interlayer insulating film 157 as a dielectric. An impurity element for imparting an n-type or a p-type conductivity is added to the impurity regions 154 to 156, as in the pixel TFT.

With such a structure, the amount of the storage capacitor can be further increased.

This embodiment can be freely combined with any one of Embodiments 1 to 9.

Embodiment 13

The CMOS circuit and the pixel portion in accordance with the present invention can be used for various electro-optical devices (the active matrix type liquid crystal display device and the active matrix type EC display device). Therefore the present invention can be applied to all those electronic appliances in which such electro-optical devices are included in the display portion.

The following can be given as such electronic appliances: a video camera, a digital camera, a projector (rear type or front type), a head-mounted display (a goggle type display), a car navigation system, a car stereo, a personal computer, and a portable information terminal (such as a mobile computer, a portable telephone or an electronic book). Examples of these are shown in FIGS. 20, 21 and 22.

Figure 20A:
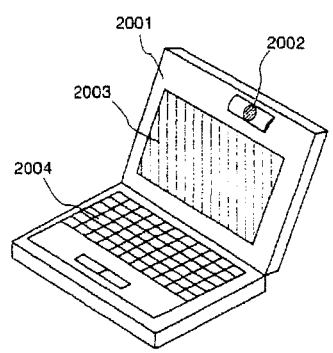
FIGS. 20A to 20F are diagrams showing examples of electric appliances (Embodiment 13)

FIG. 20A is a personal computer, and it includes a main body 2001, an image input portion 2002, a display portion 2003, and a keyboard 2004, etc. The present invention can be applied to the image input portion 2002, the display portion 2003 or other driver circuits.

Figure 20B:
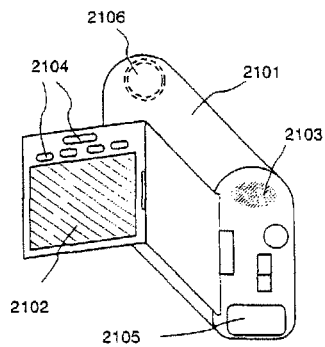

FIG. 20B is a video camera, and it includes a main body 2101, a display portion 2102, an audio input portion 2103, operation switches 2104, a battery 2105, and an image receiving portion 2106, etc. The present invention can be applied to the display portion 2102 or other driver circuits.

Figure 20C:
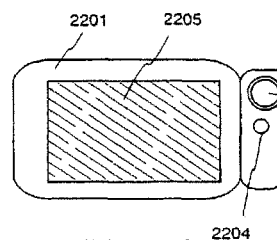

FIG. 20C is a mobile computer, and it includes a main body 2201, a camera portion 2202, an image receiving portion 2203, operation switches 2204, and a display portion 2205. The present invention can be applied to the display portion 2205 or other signal controlling circuits.

Figure 20D:
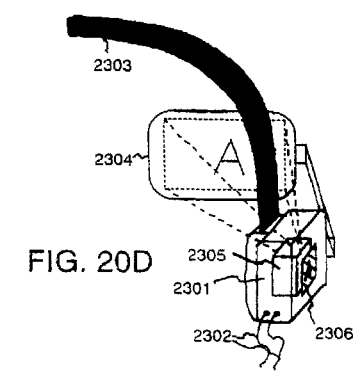

FIG. 20D is part of a head mounted type display (right-handed), and it includes a main body 2301, a signal cable 2302, a head fixation band 2303, a display portion 2304, an optical system 2305 and the display device 2306, etc. The present invention can be applied to the display device 2306.

Figure 20E:
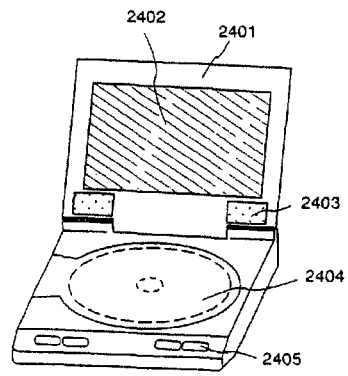

FIG. 20E is a player that uses a recording medium on which a program is recorded (hereafter referred to as a recording medium), and the player includes a main body 2401, a display portion 2402, a speaker portion 2403, a recording medium 2404, and operation switches 2405, etc. Note that this player uses a recording medium such as a DVD (digital versatile disk) or a CD, and the appreciation of music, the appreciation of film, game playing and the Internet can be performed. The present invention can be applied to the display portion 2402 or other driver circuits.

Figure 20F:
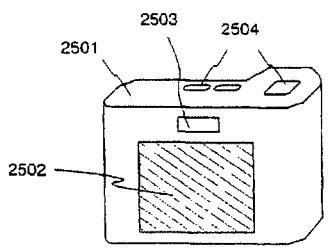

FIG. 20F is a digital camera, and it includes a main body 2501, a display portion 2502, an eyepiece portion 2503, operation switches 2504, and an image receiving portion (not shown in the figure), etc. The present invention can be applied to the display portion 2502 or other driver circuits.

Figures 21A, 21B:
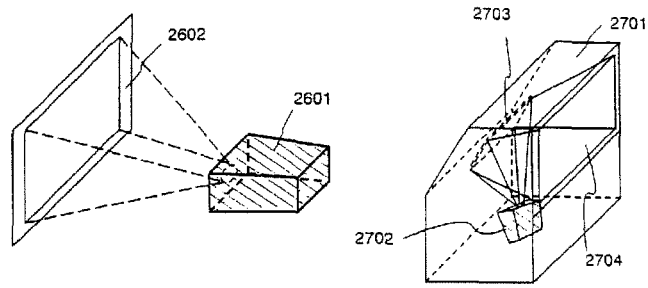
FIGS. 21A to 21D are diagrams showing examples of electric appliances (Embodiment 13)

FIG. 21A is a front type projector which comprises: a display device 2601; and a screen 2602. The present invention can be applied to the liquid crystal display device 2808 consisting one portion of the display device 2601 or other driver circuits.

FIG. 21B is a rear type projector which comprises: a main body 2701; a display device 2702; a mirror 2703; and a screen 2704. The present invention can be applied to a liquid crystal display device 2808 comprising one portion of the display device 2702 or other driver circuits.

Figure 21C:
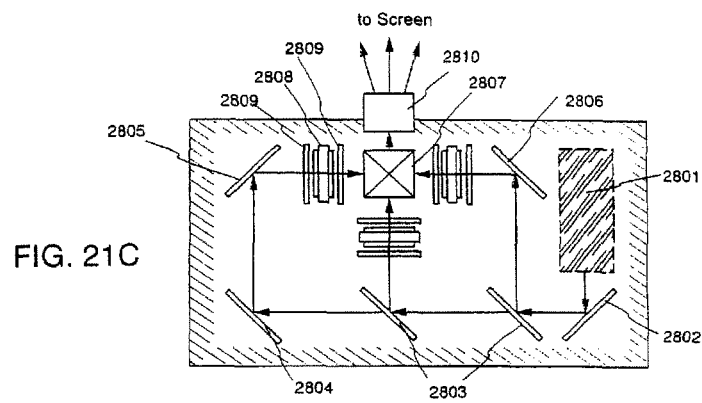

FIG. 21C is a diagram which shows an example of the structure of the display devices 2601 and 2702 of FIGS. 21A and 21B. Each of the display device 2601 and 2702 comprises: an optical light source system 2801; mirrors 2802 and 2804 to 2806; a dichroic mirror 2803; a prism 2807; a liquid crystal display device 2808; a phase differentiating plate 2809; and a projection optical system 2810. The projection optical system 2810 comprises a plurality of optical lenses having a projection lens. Though the present embodiment shows an example of 3-plate type, this is not to limit to this example and a single plate type may be used for instance. Further, an operator may appropriately dispose an optical lens, a film which has a function to polarize light, a film which adjusts a phase difference and an IR film, etc in the optical path shown by an arrow in FIG. 21C.

Figure 21D:
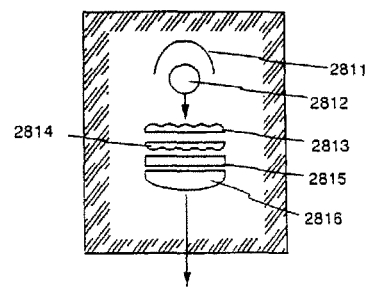

FIG. 21D is a diagram showing an example of a structure of the optical light source system 2801 of FIG. 21C. In the present embodiment the optical light source system 2801 comprises: a reflector 2811; a light source 2812; lens arrays 2813 and 2814; a polarizer conversion element 2815; and a condenser lens 2816. Note that the optical light source system shown in FIG. 21D is merely an example and the structure is not limited to this example. For instance, an operator may appropriately dispose an optical lens, a film which has a function to polarize light, a film which adjusts a phase difference and an IR film, etc.

The projector shown in FIG. 21 uses a transmission type electro-optical device and the application example to a reflection type electro-optical device is not illustrated.

Figure 22A:
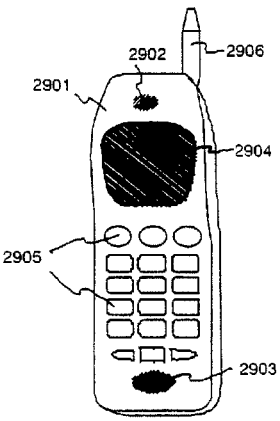
FIGS. 22A to 22C are diagrams showing examples of electric appliances (Embodiment 13)

FIG. 22A is a portable telephone which comprises: a main body 2901, an audio output portion 2902, an audio input portion 2903, a display portion 2904, operation switches 2905, and an antenna 2906, etc. The present invention can be applied to the an audio output portion 2902, an audio input portion 2903, and a display portion 2904 or other driver circuits.

Figure 22B:
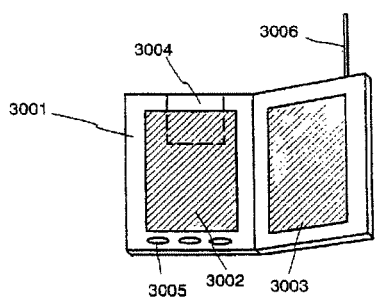

FIG. 22B is a portable book (electronic book) which comprises: a main body 3001, display portions 3002 and 3003, a recording medium 3004, operation switches 3005, and an antenna 3006, etc. The present invention can be applied to the display portions 3002 and 3003 or other driver circuits.

Figure 22C:
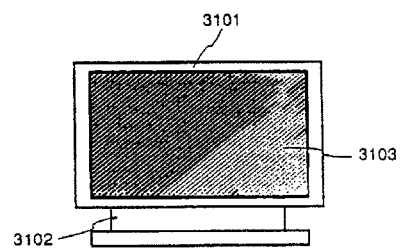
Figure 23:
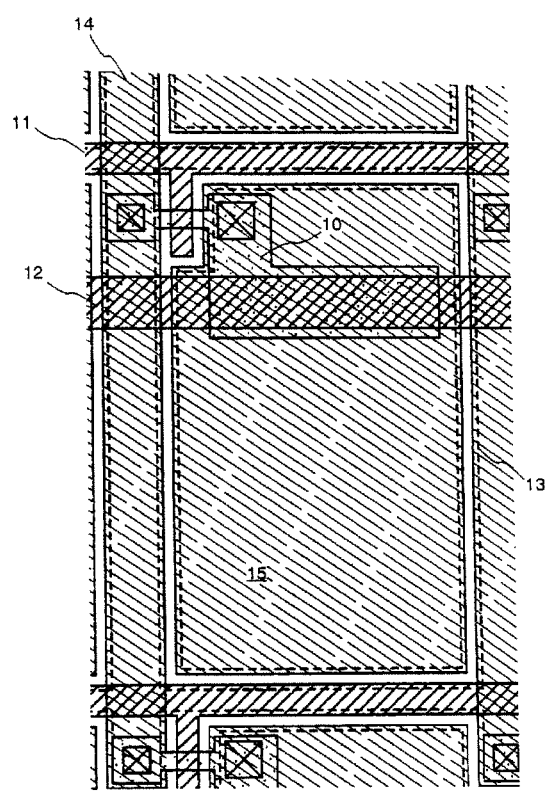
FIG. 23 is a diagram showing a conventional example.

FIG. 22C is a display which comprises: a main body 3101, a support stand 3102, and a display portion 3103, etc. The present invention can be applied to the display portion 3103. The display of the present invention is advantageous for a large size screen in particular, and is advantageous for a display equal to or greater than 10 inches (especially equal to or greater than 30 inches) in the diagonal.

The applicable range of the present invention is thus extremely wide, and it is possible to apply the present invention to electronic appliances in all fields. Further, the electronic appliances of this embodiment can be realized by using a constitution of any combination of embodiments 1 to 12.

Embodiment 14

Although the first etching treatment for forming the electrically conductive layer of the first shape is conduced under the condition where the etching is performed once in Embodiment 1, the etching treatment may be performed for a plurality of times so as to prevent the thickness of the insulating film from being reduced as well as to improve the uniformity of the shape. In this embodiment, an example where the first etching treatment is conducted twice to form the electrically conductive layer of the first shape is described.

Although tapered shapes are formed on either side of the gate electrode and LDD regions are formed on either side of the channel formation region in the present invention, this embodiment will be described with reference to FIGS. 24A to 24D illustrating enlarged cross-sectional views of only one side of the vicinity of the gate electrode in the manufacturing process. For simplicity, a base film and a substrate are not shown in FIGS. 24A to 24D.

First, following the manufacturing process of Embodiment 1, the state shown in FIG. 2A is obtained. It is sufficient to set the thickness of the first electrically conductive film to be 20 to 100 nm and the thickness of the second electrically conductive film to be 100 to 400 nm. In this embodiment, the first electrically conductive film made of TaN having the thickness of 30 nm and the second electrically conductive film made of W having the thickness of 370 nm are laminated. TaN is preferable as a material of the first electrically conductive film for its extremely high heat resistance.

Next, a mask 1405a of a first shape made of a resist is formed. Then, etching is performed by an ICP method to form a second electrically conductive film 1404a of the first shape. As a result of using a mixed gas of $CF_4$, $Cl_2$ and $O_2$ as an etching gas having a high selective ratio with respect to TaN, the state shown in FIG. 24A can be obtained. Table 1 shows the relation between various etching conditions and the etching rate of the second electrically conductive layer (W), the etching rate of the first electrically conductive layer (TaN), or the tapered angle of the second electrically conductive layer (W).

TABLE 1

Etching rates (E.R) of W and N and tapered angle of W

| No. | ICP [W] | Bias [W] | Pressure [Pa] | $CF_4$ [SCCM] | $Cl_2$ [SCCM] | $O_2$ [SCCM] | W E.R. ① [nm/min] | TaN E.R. ② [nm/min] | W/TaN selection ratio ①/② | W taper angle [deg] |
|---|---|---|---|---|---|---|---|---|---|---|
| 1 | 500 | 20 | 1.0 | 30 | 30 | 0 | 58.97 | 66.43 | 0.889 | 80 |
| 2 | 500 | 60 | 1.0 | 30 | 30 | 0 | 88.71 | 118.46 | 0.750 | 25 |
| 3 | 500 | 100 | 1.0 | 30 | 30 | 0 | 111.66 | 168.03 | 0.667 | 18 |
| 4 | 500 | 20 | 1.0 | 25 | 25 | 10 | 124.62 | 20.67 | 6.049 | 70 |
| 5 | 500 | 60 | 1.0 | 25 | 25 | 10 | 161.72 | 35.81 | 4.528 | 35 |
| 6 | 500 | 100 | 1.0 | 25 | 25 | 10 | 176.90 | 56.32 | 3.008 | 32 |
| 7 | 500 | 150 | 1.0 | 25 | 25 | 10 | 200.39 | 80.32 | 2.495 | 26 |
| 8 | 500 | 200 | 1.0 | 25 | 25 | 10 | 218.20 | 102.87 | 2.124 | 22 |
| 9 | 500 | 250 | 1.0 | 25 | 25 | 10 | 232.12 | 124.97 | 1.860 | 19 |
| 10 | 500 | 20 | 1.0 | 20 | 20 | 20 | — (*) | 14.83 | — | — |
| 11 | 500 | 60 | 1.0 | 20 | 20 | 20 | 193.02 | 14.23 | 13.695 | 37 |
| 12 | 500 | 100 | 1.0 | 20 | 20 | 20 | 235.27 | 21.81 | 10.856 | 29 |
| 13 | 500 | 150 | 1.0 | 20 | 20 | 20 | 276.74 | 38.61 | 7.219 | 26 |
| 14 | 500 | 200 | 1.0 | 20 | 20 | 20 | 290.10 | 45.30 | 6.422 | 24 |
| 15 | 500 | 250 | 1.0 | 20 | 20 | 20 | 300.34 | 50.25 | 6.091 | 22 |

(*) The mark — in the cells indicates that the measurement was impossible due to change in quality of the surface of W during etching.

Figure 24A:
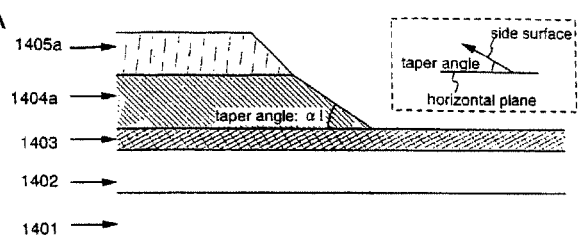
FIGS. 24A to 24D are enlarged cross-sectional views showing the manufacturing process of an active matrix substrate.

The term "tapered angle" in the specification indicates an angle formed between the horizontal plane and the side face of the material layer as shown in the upper right part of FIG. 24A.

The angle (tapered angle α1) formed between the horizontal plane and the side face of the second electrically conductive layer (W) can be freely set between 19 and 70 degrees by setting the first etching condition to, for example, one of the conditions 4 through 15 in Table 1. The etching time may be appropriately set by the implementers.

In FIG. 24A, a semiconductor layer is denoted by the reference numeral 1401, an insulating film by 1402, and a first electrically conductive film by 1403.

Next, etching is conducted under the second etching condition with the mask 1405a being left as it is to form the first electrically conductive layer 1403 of the first shape. During etching under the second etching condition, the insulating film 1402 is also etched to certain degree, resulting in an insulating film 1402a of the first shape. In this embodiment, a mixed gas of $CF_4$ and $Cl_2$ is used as an etching gas for the second etching condition. As the second etching condition, for example, any one of the conditions 1 through 3 in Table 1 may be used. As described above, by conducting the first etching treatment under the conditions where the etching is performed twice, the thickness of the insulating film 1402 can be prevented from being reduced.

Figure 24B:
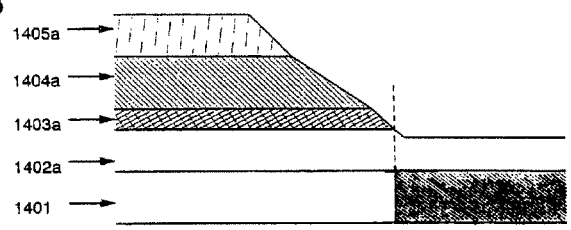

Next, a first doping treatment is conducted. An impurity element for imparting one conductivity to the semiconductor, phosphorus for imparting an n-type conductivity in this embodiment, is added to the semiconductor layer 1401 by an ion doping method, using the first electrically conductive layer 1403a of the first shape and the second electrically conductive layer 1404a of the first shape as masks (FIG. 24B). Although the second electrically conductive layer 1404a of the first shape is also etched to certain degree during the etching under the second etching condition in FIG. 24B, the second electrically conductive layer 1404a is shown as having the same shape as that shown in FIG. 24A because the amount of etching is small.

Figure 24C:
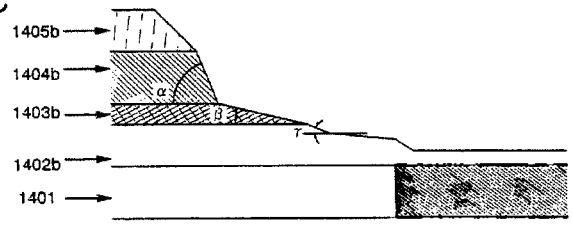

Next, a second etching is conducted with the mask 1405a being left as it is to obtain the state shown in FIG. 24C. In this embodiment, after etching is conducted as a second etching treatment under the first etching condition where a mixed gas of $CF_4$ and $Cl_2$ is used as an etching gas, etching is conducted under the second etching condition where a mixed gas of $CF_4$, $Cl_2$ and $O_2$ is used as an etching gas. As these etching conditions, any one of the conditions in Table 1 may be used and the etching time may be appropriately set. A width of each of the electrically conductive layers in the longitudinal direction of the channel can be freely set by selecting the etching condition. The second etching treatment allows the formation of a mask 1405b of a second shape, a first electrically conductive layer 1403b of the second shape, a second electrically conductive layer 1404b of the second shape, and an insulating film 1402b of the second shape.

The second electrically conductive layer 1404b of the second shape forms a tapered angle α2 greater than the tapered angle α1 whereas the first electrically conductive layer 1403b of the second shape forms an extremely small tapered angle β. Also in the insulating film 1402b of the second shape, a tapered angle γ is partially formed.

Figure 24D:
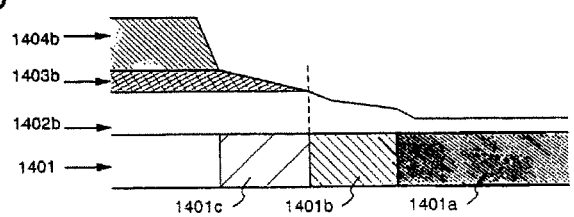

Next, after removal of the mask 1405b, a second doping treatment is conducted (FIG. 24D). The second doping treatment performs the doping at a concentration lower than that of the first doping treatment. In this embodiment, phosphorus for imparting an n-type conductivity is added to the semiconductor layer 1401 by an ion doping method, using the second electrically conductive layer 1404b of the second shape as a mask.

As a result of the second doping treatment, impurity regions 1401a through 1401c are formed. A portion of the semiconductor layer overlapping the second electrically conductive layer sandwiching the insulating film and the first electrically conductive layer therebetween serves as a channel formation region. Although not shown, the impurity regions 1401a through 1401c are formed on both sides of the channel formation region in a symmetrical manner.

In the doping, the thicker the thickness of the material layer positioned on the semiconductor layer becomes, the shallower ions are implanted. Accordingly, the impurity region 1401c overlapping the first electrically conductive layer sandwiching the insulating film therebetween, that is, the third impurity region (GOLD region), is affected by the tapered portion having the side face of the tapered angle β, resulting in change in the concentration of the impurity element to be added to the semiconductor layer. The concentration of the impurity decreases as the thickness of the material layer increases, and the concentration of the impurity increases as the thickness of the material layer decreases.

Similarly, the impurity region 1401b, that is, the second impurity region (LDD region), is affected by the thickness of the insulating film 1402b of the second shape, resulting in change in the concentration of the impurity element to be added to the semiconductor layer. Specifically, the impurity region 1401b is affected by the thickness of the tapered portion having the side face of the tapered angle γ or other tapered portions, resulting in change in the concentration of the impurity element to be added to the semiconductor layer. The impurity region 1401b that does not overlap the first electrically conductive layer has a higher concentration than that of the impurity region 1401c. Moreover, the width of the impurity region 1401b in the longitudinal direction of the channel is as long as that of the impurity region 1401c, or is greater than that of the impurity region 1401c.

The impurity region 1401a, that is, the first impurity region contains an impurity element added by the second doping treatment in addition to the impurity element added by the first doping treatment. As a result, the impurity region 1401a becomes a high-concentration impurity region to function as a source region or a drain region.

As the successive steps, the manufacturing process of Embodiment 1 shown in FIG. 3B and from there on may be conducted to manufacture the active matrix substrate.

By the above method, TFTs of the pixel portion and TFTs of the driver circuit are formed.

This embodiment can be freely combined with any one of Embodiments 1 through 4 and Embodiments 7 through 13.

In the case where a mixed gas of $SF_6$ and $Cl_2$ is used instead of the etching gas of this embodiment (mixed gas of CF, and $Cl_2$) or a mixed gas of $SF_4$, $Cl_2$ and $O_2$ is used instead of the mixed gas of $SF_4$, $Cl_2$ and $O_2$, the reduction in the thickness can be further prevented because a selective ratio of these gases with respect to the insulating film 1402 is extremely high.

According to the present invention, a liquid crystal display device having a pixel structure having a high aperture ratio realized by the present invention can be accomplished without increasing the number of masks and the number of manufacturing steps.

What is claimed is:
1. A semiconductor device comprising:
 a pixel portion over a substrate, the pixel portion comprising:
  a first electrode;
  a semiconductor layer;
  an insulating film over the first electrode, the insulating film comprising a contact hole;
  a first conductive film over the insulating film, the first conductive film being electrically connected to the semiconductor layer;
  a second conductive film over the first conductive film;
  a third conductive film; and
  a fourth conductive film over the insulating film; and
 a terminal portion over the substrate, the terminal portion comprising:
  a first wiring;
  a second wiring over the first wiring; and
  a third wiring over the second wiring,
 wherein the semiconductor layer and the first electrode overlap with each other,
 wherein the third conductive film, the first electrode and the first wiring comprise a same material,
 wherein the second wiring and the first conductive film comprises a same material,
 wherein the third wiring and the second conductive film comprise a same material,
 wherein the second wiring is electrically connected to the first wiring through the contact hole of the insulating film,
 wherein the third wiring is electrically connected to the second wiring, wherein the third conductive film extends in a direction such that the third conductive film and the second conductive film do not overlap with each other, wherein the fourth conductive film and the third conductive film overlap with each other, wherein the fourth conductive film and the first electrode overlap with each other, and wherein the second conductive film and the fourth conductive film is configured to generate an electric field substantially parallel to a surface of the substrate.

2. The semiconductor device according to claim 1, wherein the third conductive film is electrically connected to the semiconductor layer.

3. The semiconductor device according to claim 1, wherein the first electrode is over the semiconductor layer.

4. The semiconductor device according to claim 1, further comprising a flexible printed circuit electrically connected to the third wiring, wherein the third wiring comprises a region, wherein the region and the second wiring overlap with each other, and wherein the region and the flexible printed circuit.

5. An electronic appliance comprises the semiconductor device according to claim 1 and an operation switch.

6. A semiconductor device comprising:

a pixel portion over a substrate, the pixel portion comprising:
  a first electrode;
  a semiconductor layer;
  an insulating film over the first electrode, the insulating film comprising a contact hole;
  a first conductive film over the insulating film, the first conductive film being electrically connected to the semiconductor layer;
  a second conductive film over the first conductive film;
  a third conductive film; and
  a fourth conductive film over the insulating film; and a terminal portion over the substrate, the terminal portion comprising:
  a first wiring;
  a second wiring over the first wiring; and
  a third wiring over the second wiring, wherein the semiconductor layer and the first electrode overlap with each other, wherein the third conductive film, the first electrode and the first wiring are formed by processing a same film, wherein the second wiring and the first conductive film are formed by processing a same film, wherein the third wiring and the second conductive film are formed by processing a same film, wherein the second wiring is electrically connected to the first wiring through the contact hole of the insulating film, wherein the third wiring is electrically connected to the second wiring, wherein the third conductive film extends in a direction such that the third conductive film and the second conductive film do not overlap with each other, wherein the fourth conductive film and the third conductive film overlap with each other, wherein the fourth conductive film and the first electrode overlap with each other, and wherein the second conductive film and the fourth conductive film is configured to generate an electric field substantially parallel to a surface of the substrate.

7. The semiconductor device according to claim 6, wherein the third conductive film is electrically connected to the semiconductor layer.

8. The semiconductor device according to claim 6, wherein the first electrode is over the semiconductor layer.

9. The semiconductor device according to claim 6, further comprising a flexible printed circuit electrically connected to the third wiring, wherein the third wiring comprises a region, wherein the region and the second wiring overlap with each other, and wherein the region and the flexible printed circuit.

10. An electronic appliance comprises the semiconductor device according to claim 6 and an operation switch.

11. A display device comprising:

a pixel portion over a substrate, the pixel portion comprising:
  a liquid crystal;
  a first electrode;
  a semiconductor layer;
  an insulating film over the first electrode, the insulating film comprising a contact hole;
  a first conductive film over the insulating film, the first conductive film being electrically connected to the semiconductor layer;
  a second conductive film over the first conductive film;
  a third conductive film; and
  a fourth conductive film over the insulating film; and a terminal portion over the substrate, the terminal portion comprising:
  a first wiring;
  a second wiring over the first wiring; and
  a third wiring over the second wiring, wherein the semiconductor layer and the first electrode overlap with each other, wherein the third conductive film, the first electrode and the first wiring comprise a same material, wherein the second wiring and the first conductive film comprises a same material, wherein the third wiring and the second conductive film comprise a same material, wherein the second wiring is electrically connected to the first wiring through the contact hole of the insulating film, wherein the third wiring is electrically connected to the second wiring, wherein the third conductive film extends in a direction such that the third conductive film and the second conductive film do not overlap with each other, wherein the fourth conductive film and the third conductive film overlap with each other, wherein the fourth conductive film and the first electrode overlap with each other, wherein the second conductive film and the fourth conductive film is configured to generate an electric field substantially parallel to a surface of the substrate, and wherein the liquid crystal is controlled by the electric field.

12. The display device according to claim 11, wherein the third conductive film is electrically connected to the semiconductor layer.

13. The display device according to claim 11, wherein the first electrode is over the semiconductor layer.

14. The display device according to claim 11, further comprising a flexible printed circuit electrically connected to the third wiring, wherein the third wiring comprises a region, wherein the region and the second wiring overlap with each other, and wherein the region and the flexible printed circuit.

15. An electronic appliance comprises the display device according to claim 11 and an operation switch.

16. A display device comprising:
- a pixel portion over a substrate, the pixel portion comprising:
  - a liquid crystal;
  - a first electrode;
  - a semiconductor layer;
  - an insulating film over the first electrode, the insulating film comprising a contact hole;
  - a first conductive film over the insulating film, the first conductive film being electrically connected to the semiconductor layer;
  - a second conductive film over the first conductive film;
  - a third conductive film; and
  - a fourth conductive film over the insulating film; and
- a terminal portion over the substrate, the terminal portion comprising:
  - a first wiring;
  - a second wiring over the first wiring; and
  - a third wiring over the second wiring, wherein the semiconductor layer and the first electrode overlap with each other, wherein the third conductive film, the first electrode and the first wiring are formed by processing a same film, wherein the second wiring and the first conductive film are formed by processing a same film, wherein the third wiring and the second conductive film are formed by processing a same film, wherein the second wiring is electrically connected to the first wiring through the contact hole of the insulating film, wherein the third wiring is electrically connected to the second wiring, wherein the third conductive film extends in a direction such that the third conductive film and the second conductive film do not overlap with each other, wherein the fourth conductive film and the third conductive film overlap with each other, wherein the fourth conductive film and the first electrode overlap with each other, wherein the second conductive film and the fourth conductive film is configured to generate an electric field substantially parallel to a surface of the substrate, and wherein the liquid crystal is controlled by the electric field.

17. The display device according to claim 16, wherein the third conductive film is electrically connected to the semiconductor layer.

18. The display device according to claim 16, wherein the first electrode is over the semiconductor layer.

19. The display device according to claim 16, further comprising a flexible printed circuit electrically connected to the third wiring, wherein the third wiring comprises a region, wherein the region and the second wiring overlap with each other, and wherein the region and the flexible printed circuit.

20. An electronic appliance comprises the display device according to claim 16 and an operation switch.

* * * * *

UNITED STATES PATENT AND TRADEMARK OFFICE
CERTIFICATE OF CORRECTION

PATENT NO. : 8,704,233 B2
APPLICATION NO. : 13/829922
DATED : April 22, 2014
INVENTOR(S) : Shunpei Yamazaki and Jun Koyama It is certified that error appears in the above-identified patent and that said Letters Patent is hereby corrected as shown below:

In the Specification

Column 2, line 48, after "each" delete ",";

Column 8, line 33, after "137" replace ";" with --,--;

Column 8, line 37, after "second" delete "to";

Column 9, line 50, before "TFT when" delete "channel";

Column 10, line 56, after "400" replace "ml/cm$^2$" with --mJ/cm$^2$--;

Column 11, line 2, after "silicon" delete "to";

Column 11, line 9, after "with" delete ",";

Column 11, line 57, replace "CF," with --CF$_4$--;

Column 12, line 18, after "time" delete "to";

Column 12, line 38, replace "O$_3$" with --O$_2$--;

Column 13, line 31, after "concentration" delete ",";

Column 13, line 36, after "removing the" delete "to";

Column 14, line 67, after "131" replace ";" with --,--;

Column 15, line 43, after "6" replace ":" with --.--;

Column 19, line 6, after "indium oxide" replace "(In$_2$O$_5$)" with --(In$_2$O$_3$)--;

Column 21, line 33, replace "CHF," with --CHF$_3$--;

Signed and Sealed this
Twenty-fourth Day of February, 2015

Michelle K. Lee
*Deputy Director of the United States Patent and Trademark Office*

CERTIFICATE OF CORRECTION (continued)
U.S. Pat. No. 8,704,233 B2

Column 22, line 53, after "are formed" replace "," with --.--;

Column 23, line 15, after "made in" delete ",";

Column 24, line 4, replace "gale" with --gate--;

Column 24, line 56, after "promoting" delete "to";

Column 25, line 7, replace "1×10"" with --1 × $10^{17}$--;

Column 26, line 26, replace "Substrate" with --substrate--;

Column 26, line 40, after "1202" replace ":" with --.--;

Column 32, line 24, replace "CF," with --$CF_4$--.